US012050235B2

(12) United States Patent
Lin et al.

(10) Patent No.: US 12,050,235 B2
(45) Date of Patent: Jul. 30, 2024

(54) HEAT DISSIPATABLE DIE UNIT AND PROBE SEAT USING THE SAME

(71) Applicant: MPI CORPORATION, Chu-Pei (TW)

(72) Inventors: Chin-Yi Lin, Chu-Pei (TW); Keng-Min Su, Chu-Pei (TW); Che-Wei Lin, Chu-Pei (TW); Ko-Chun Wu, Chu-Pei (TW)

(73) Assignee: MPI CORPORATION, Hsinchu Shien (TW)

( * ) Notice: Subject to any disclaimer, the term of this patent is extended or adjusted under 35 U.S.C. 154(b) by 380 days.

(21) Appl. No.: 17/569,080

(22) Filed: Jan. 5, 2022

(65) Prior Publication Data

US 2022/0214380 A1 Jul. 7, 2022

Related U.S. Application Data

(60) Provisional application No. 63/134,735, filed on Jan. 7, 2021.

(51) Int. Cl.
*G01R 1/00* (2006.01)
*G01R 1/073* (2006.01)
*G01R 1/44* (2006.01)

(52) U.S. Cl.
CPC ........... *G01R 1/44* (2013.01); *G01R 1/07342* (2013.01)

(58) Field of Classification Search
CPC .................................. G01R 1/07342
See application file for complete search history.

(56) References Cited

U.S. PATENT DOCUMENTS

| | | | | |
|---|---|---|---|---|
| 4,961,052 A | * | 10/1990 | Tada | G01R 1/07342 324/762.05 |
| 6,310,484 B1 | * | 10/2001 | Akram | G01R 1/0735 324/754.16 |
| 7,458,816 B1 | * | 12/2008 | Mathieu | G01R 1/07357 439/66 |
| 7,511,524 B1 | * | 3/2009 | Lee | G01R 1/06727 324/755.07 |

(Continued)

FOREIGN PATENT DOCUMENTS

| | | |
|---|---|---|
| CN | 102375080 A | 3/2012 |
| JP | 2015-132524 A | 7/2015 |

*Primary Examiner* — Phuong Chi Thi Nguyen
(74) *Attorney, Agent, or Firm* — Birch, Stewart, Kolasch & Birch, LLP

(57) ABSTRACT

A heat dissipatable die unit includes an outer die, a metal heat dissipating layer and an inner die piled in order. The inner die includes a probe installation section, and a peripheral portion surrounding the probe installation section and having an inner connecting surface for being connected to a die and an outer connecting surface opposite thereto. The probe installation section has a recessed portion recessed from the inner connecting surface, and a protruding portion protruding from the outer connecting surface, thereby forming a level difference portion bordering the peripheral portion. The outer die includes an installation recess and a supporting portion surrounding the installation recess. The installation recess is recessed from an inner surface of the supporting portion and accommodates the protruding portion of the inner die. The metal heat dissipating layer is disposed between the peripheral portion and the supporting portion to attain heat dissipating effect.

20 Claims, 22 Drawing Sheets

(56) References Cited

U.S. PATENT DOCUMENTS

| | | | |
|---|---|---|---|
| 11,175,311 B1* | 11/2021 | Rosas | G01R 1/06772 |
| 2002/0055282 A1* | 5/2002 | Eldridge | G01R 1/0483 |
| | | | 257/E23.078 |
| 2015/0008946 A1* | 1/2015 | Inoue | G01R 31/2887 |
| | | | 324/750.03 |
| 2015/0362551 A1* | 12/2015 | Saunders | G01R 31/2889 |
| | | | 324/754.03 |
| 2017/0250146 A1* | 8/2017 | Warwick | G01R 31/2889 |

* cited by examiner

| lower die unit | | no metal heat dissipating layer | metal heat dissipating layer has no gap | metal heat dissipating layer has gaps |
|---|---|---|---|---|
| outer die | highest temperature (°C) | 125.05 | 125.05 | 125.05 |
| | lowest temperature (°C) | 114.99 | 114.62 | 114.48 |
| metal heat dissipating layer | highest temperature (°C) | | 117.11 | 116.79 |
| | lowest temperature (°C) | | 114.62 | 114.48 |
| inner die | highest temperature (°C) | 118.2 | 117.16 | 117.8 |
| | lowest temperature (°C) | 114.93 | 114.62 | 114.48 |
| | percentage of area with temperature higher than 116°C | 40% | 32% | 15% |

FIG. 24

HEAT DISSIPATABLE DIE UNIT AND PROBE SEAT USING THE SAME

CROSS REFERENCE TO RELATED APPLICATION

This non-provisional application claims the benefit under 35 U.S.C. § 119(e) to U.S. Provisional Application No. 63/134,735, filed on Jan. 7, 2021, all of which is hereby expressly incorporated by reference into the present application.

BACKGROUND OF THE INVENTION

1. Field of the Invention

The present invention relates to die units of probe seats of probe cards and more particularly, to a heat dissipatable die unit, and a probe seat using the die unit.

2. Description of the Related Art

Referring to FIG. 1, a conventional probe card primarily includes a probe head 10, a main circuit board 16, and a space transformer 19 disposed between the main circuit board 16 and the probe head 10. The probe head 10 primarily includes a probe seat 11 and a plurality of probes 12. In practice the probe head includes hundreds or even thousands of probes, but only three probes are shown in FIG. 1 for concise illustrative purpose. The probe seat 11 usually includes a die such as a middle die 13, and upper and lower die units 14 and 15 disposed on top and bottom surfaces of the middle die 13 respectively. Each of the upper and lower die units 14 and 15 usually includes an inner die 142 or 152 connected with the middle die 13, and an outer die 144 or 154 connected with the inner die 142 or 152, to avoid the problem that a single die is too thick and thereby difficult to be drilled. For each of the die units 14, 15, the inner and outer dies are usually adhered to each other, and then fastened to each other and fastened to the middle die 13 by bolts 17. Besides, the inner and outer dies 142, 152, 144 and 154 of the upper and lower die units 14 and 15 are each provided with a plurality of probe holes 18 with tiny size for the probes 12 to be inserted therethrough. The bottom end (i.e. probe tip) of each probe 12 protrudes below the lower die unit 15 for probing an electrically conductive contact of a device under test (not shown). The top end of each probe 12 protrudes above the upper die unit 14 to be abutted against an electrically conductive contact (not shown) provided on a bottom surface of the space transformer 19. Alternatively, there may be no such space transformer 19, and the top end of each probe 12 is directly abutted against an electrically conductive contact provided on a bottom surface of the main circuit board 16.

SUMMARY OF THE INVENTION

However, when the above-described conventional probe head 10 performs a test under high temperature, the device under test is heated to a specific temperature, such as 100° C. or higher. The heat is transmitted to the probe head 10 by conduction or radiation. Especially, where relatively closer to the device under test, such as the lower die unit 15, is heated even more obviously. Besides, the electrical signal transmission between the probes 12 and the device under test also generates some heat, which also heats the dies. Taking the lower die unit 15 as an example, the outer die 154 is located relatively closer to the device under test, so it is heated more than the inner die 152 is heated. In other words, the heated inner and outer dies 152 and 154 have a temperature difference therebetween, so that the inner and outer dies 152 and 154 will deform with different degrees. Because the inner and outer dies 152 and 154 are adhered to each other in a surface contact manner, the aforementioned different degree of deformation will make the inner and outer dies 152 and 154 bend, resulting in that the probes 12 will slightly slant and thereby making the tips of the probes 12 inaccurate in position.

Therefore, it is an objective of the present invention to provide a die unit for the usage in a probe seat, which has a heat dissipating function, especially lowering the influence of heat on deformation of dies, thereby ensuring positions of tips of probes.

To attain the above objective, the present invention arranges a metal heat dissipating layer between an outer die and an inner die and makes them piled in order from a surface of a die, such as middle die.

In this way, when a probe head having the die unit performs a test under high temperature, the metal heat dissipating layer can transmit heat from where close to the center of the probe head, i.e., the inside of the probe head, to the outer periphery of the probe head so as to dissipate the heat to the external environment, thereby attaining the effect of improving heat dissipation.

However, the arrangement of the metal heat dissipating layer between the inner die and the outer die for improving the heat dissipating effect of the probe head will increase the thickness of the die unit, such as the die unit disposed on the side of the middle die close to the device under test. At this circumstance, for ensuring the length of the part of the probe downwardly protruding out of the lower die unit, the length of the probe should be increased. But the length increase of the probe will affect its electrical property such as high frequency property, and performance of mechanical geometry. In other words, exceeding length of the probe will break the design of the original electrical and mechanical specifications of the probe. Besides, a vertical size of the probe seat protruding out of a bottom surface of a substrate (the main circuit board of the probe card) is defined as the overall depth of the probe seat, which is restricted by hardware specifications of a test machine and thereby has an upper limit. Therefore, the arrangement of the metal heat dissipating layer should not result in increase of the overall depth of the probe seat and the required length of the probe.

Therefore, the present invention is the result of a further review. For ensuring the length of the part of the probe protruding downwardly from the bottom surface of the probe seat, the length of the probe should be provided according to the depth of the probe seat, i.e., the distance between the bottom surface of the main circuit board of the probe card and the bottom surface of the probe seat. Further, the length of the probe will affect its high frequency property, and the depth of the probe seat is restricted by the test machine. Therefore, the depth of the probe seat should be prevented from increased resulted from the arrangement of the metal heat dissipating layer. As a result, a solution capable of solving the above-mentioned problems has been found, and the present invention given hereinbelow is conceived.

The present invention provides a die unit for being disposed on a surface of a die, such as a middle die. The die unit includes an outer die, an inner die, and a metal heat dissipating layer. The inner die, the metal heat dissipating layer and the outer die are piled in order from the surface of the die (e.g., the middle die). The inner die includes a probe installation section for a plurality of probes to be inserted therethrough, and a peripheral portion surrounding the probe installation section. The peripheral portion is provided on opposite sides thereof with an outer connecting surface, and an inner connecting surface for being connected to the die (e.g., the middle die). The probe installation section has a recessed portion recessed from the inner connecting surface, and a protruding portion protruding from the outer connecting surface, so that the probe installation section is formed with a level difference portion bordering the peripheral portion. The outer die includes an installation recess for the probes to be inserted therethrough, and a supporting portion surrounding the installation recess. The supporting portion has an inner surface. The installation recess is recessed from the inner surface. The installation recess is larger than the protruding portion of the inner die. The protruding portion is accommodated in the installation recess. The metal heat dissipating layer is disposed between the peripheral portion of the inner die and the supporting portion of the outer die.

As a result, the die unit is appliable in a probe seat. The probe seat is adapted for being inserted with probes therethrough, thereby forming a probe head. When the probe head performs a test under high temperature and the probe head is heated by the heat resulted from the electrical signal transmission by the probes or the heated device under test, the metal heat dissipating layer can transmit the heat inside the probe head to the outer periphery of the probe head, thereby attaining heat dissipating effect.

Besides, by the structural configuration that the outer die has the installation recess and the inner die has the level difference portion, the present invention can be ensured in thickness after the inner and outer dies are combined. In this way, it can avoid increase of the required length of the probes and the resulting affection on high frequency property thereof, and prevent the arrangement of the metal heat dissipating layer from causing the probe seat too large depth to meet the specification requirements of the machines of various manufacturers.

In addition, after the arrangement of the metal heat dissipating layer, when a metal heat dissipating sheet is installed, a probe damage problem may be caused by improper installation of the metal heat dissipating sheet, such as inserting to the probe installation section too much. Therefore, the probe installation section of the inner die has the protruding portion to make the metal heat dissipating layer only located around the outer periphery of the probe installation section or abutted against lateral sides of the protruding portion so as to disable the metal heat dissipating layer from entering the probe installation section, so that the metal heat dissipating layer (metal heat dissipating sheet) is prevented from contacting the probes when being detached or installed by the user.

Thus, the heat dissipatable die unit provided by the present invention can not only reduce affection of heat on deformation of dies, but also make the probe seat maintained with the required depth to meet the requirement of test machines and prevent the probes from increase of the required length thereof to ensure the high frequency property thereof.

The metal heat dissipating layer in the present invention may include a plurality of metal heat dissipating sheets separatable from each other. The metal heat dissipating sheets may be arranged surrounding the protruding portion collectively, so that the protruding portion of the probe installation section of the inner die is located in the space surrounded by the metal heat dissipating sheets collectively. Such metal heat dissipating layer has great heat dissipating effect, and the metal heat dissipating layer is annularly arranged around the outer periphery of the protruding portion of the inner die, thereby providing great support between the inner and outer dies and preventing the probe seat from uneven thickness.

The metal heat dissipating layer in the present invention may be composed of a plurality of metal heat dissipating sheets which are originally separatable from each other directly, so that the user can directly take out the metal heat dissipating sheets of the metal heat dissipating layer after removing fastening members of the probe seat, and then install another metal heat dissipating layer with different heat dissipating efficiency. However, the metal heat dissipating layer in the present invention may be monolithically and annularly made and provided with a plurality of tearing lines which divide the metal heat dissipating layer into a plurality of metal heat dissipating sheets. In other words, the metal heat dissipating sheets are originally connected monolithically. The user can tear the metal heat dissipating layer along the tearing lines to separate the metal heat dissipating sheets from each other. Alternatively, the metal heat dissipating layer in the present invention may be not composed of a plurality of metal heat dissipating sheets, but monolithically and annularly made to define a hollow portion, in which the protruding portion of the probe installation section of the inner die is located. Besides, the metal heat dissipating layer has an inner periphery defining the hollow portion, an outer periphery, and a tearing line extending from the inner periphery to the outer periphery, so that the user can tear the metal heat dissipating layer along the tearing line to take out the metal heat dissipating layer.

The present invention further provides a probe seat which comprises a middle die, and upper and lower die units. The middle die has a top surface, a bottom surface opposite to the top surface, and an accommodating hole penetrating through the top surface and the bottom surface. The upper and lower die units are disposed on the top surface and the bottom surface of the middle die respectively. At least one of the upper and lower die units is the aforementioned heat dissipatable die unit, the recessed portion of the inner die of which and the accommodating hole of the middle die collectively form a probe accommodating space.

The detailed structure, features, assembly or usage of the heat dissipatable die unit and the probe seat using the die unit provided by the present invention will be described in the following detailed description of embodiments. However, those skilled in the field of the present invention should understand that the detailed descriptions and specific embodiments instanced for implementing the present invention are given by way of illustration only, not intended to limit the scope of the claims of the present invention.

BRIEF DESCRIPTION OF THE DRAWINGS

FIG. 24 is a chart showing a simulated result of the present invention.

DETAILED DESCRIPTION OF THE INVENTION

Figure 1:
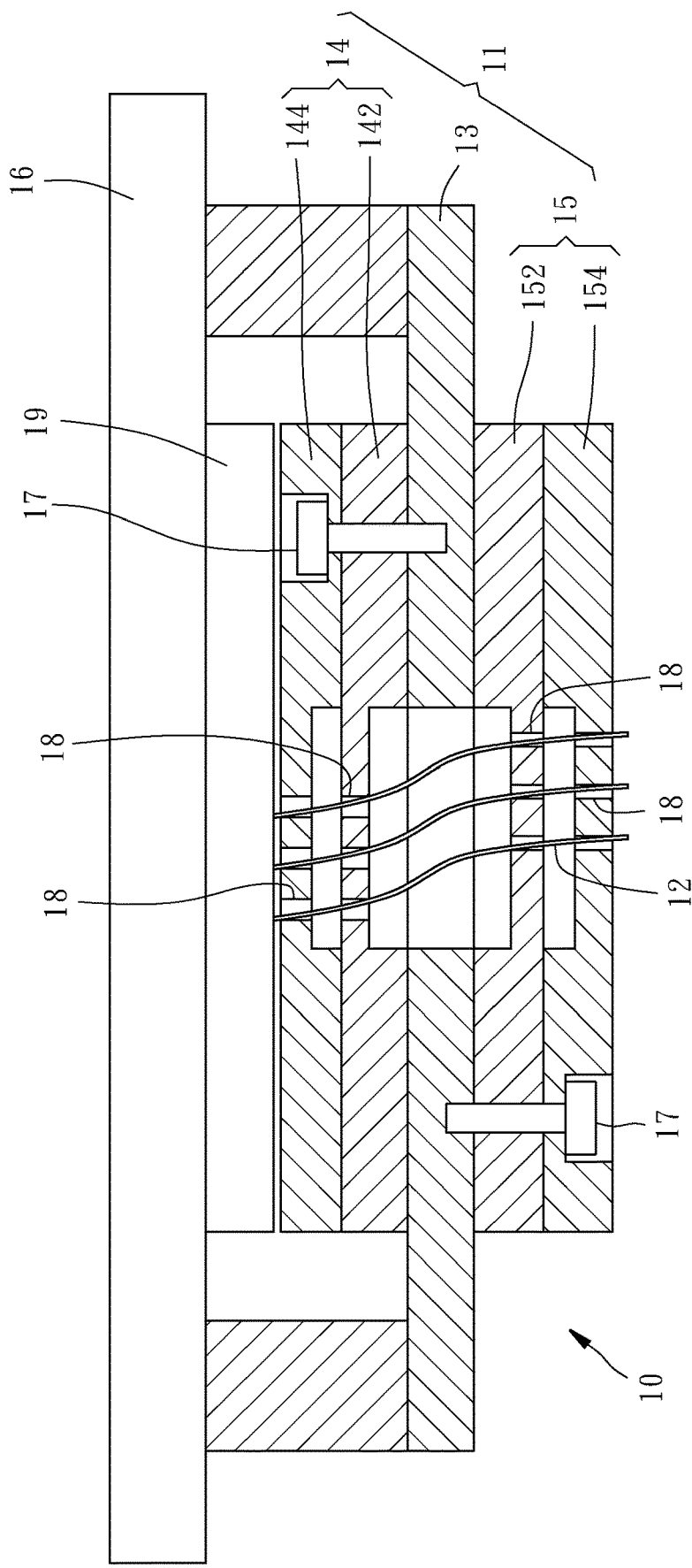
FIG. 1 is a schematical sectional view of a conventional probe card.

First of all, it is to be mentioned that same reference numerals used in the following embodiments and the appendix drawings designate same or similar elements or the structural features thereof. It should be noticed that for the convenience of illustration, the components and the structure shown in the figures are not drawn according to the real scale and amount, and the features mentioned in each embodiment can be applied in the other embodiments if the application is possible in practice. Besides, when it is mentioned that an element is disposed on another element, it means that the former element is directly disposed on the latter element, or the former element is indirectly disposed on the latter element through one or more other elements between aforesaid former and latter elements. When it is mentioned that an element is directly disposed on another element, it means that no other element is disposed between aforesaid former and latter elements.

Referring to FIG. 2 to FIG. 5, a probe seat 20 according to a first preferred embodiment of the present invention primarily includes a die such as a middle die 30, and two die units, i.e., an upper die unit 40A and a lower die unit 40B.

In this embodiment, the middle die 30 is rectangle-shaped and has two opposite surfaces, i.e., a top surface 31 and a bottom surface 32, a rectangular accommodating hole 33 located at the center of the middle die 30 and penetrating through the top and bottom surfaces 31 and 32, and a plurality of threaded holes 34 and 35 and through holes 36 and 37 surrounding the accommodating hole 33. The middle die 30 is adapted to carry the upper die unit 40A and lower die unit 40B and provide the upper die unit 40A and lower die unit 40B great supportive rigidity.

Each of the upper and lower die units 40A and 40B in this embodiment includes an inner die 41, an outer die 42, and four fastening members 60. Each of the inner and outer dies 41 and 42 is rectangle-shaped and sized smaller than the middle die 30. The fastening members 60 are bolts. Each of the inner dies 41 includes a probe installation section 413, and a peripheral portion 417 surrounding the probe installation section 413. The peripheral portion 417 has an outer connecting surface 411, and an inner connecting surface 412 opposite to the outer connecting surface 411. The probe installation section 413 has a rectangular protruding portion 414 protruding from the outer connecting surface 411, and a rectangular recessed portion 415 recessed from the inner connecting surface 412. The recessed portion 415 is located correspondingly to the protruding portion 414 and sized smaller than the protruding portion 414, so that the probe installation section 413 is formed with a level difference portion 413a bordering the peripheral portion 417. Each of the inner dies 41 further has a plurality of fastening holes 416 and through holes 418 and 419 surrounding the probe installation section 413. Each of the outer dies 42 includes an inner surface 421, an outer surface 422, an installation recess 423, and a supporting portion 425 surrounding the installation recess 423. The inner surface 421 and the outer surface 422 face opposite directions. Specifically speaking, the inner surface 421 faces toward the outer connecting surface 411 of the inner die 41. The installation recess 423 is recessed from the inner surface 421 and rectangle-shaped. The installation recess 423 is larger than the protruding portion 414 of the inner die 41 for accommodating the protruding portion 414. Each of the outer dies 42 further has a plurality of fastening holes (counter bores) 424 and through holes 426 and 427 surrounding the installation recess 423.

The upper die unit 40A is disposed in a way that the inner connecting surface 412 of the inner die 41 is connected to the top surface 31 of the middle die 30, the inner surface 421 of the outer die 42 is connected to the outer connecting surface 411 of the inner die 41, and the protruding portion 414 of the inner die 41 is located in the installation recess 423 of the outer die 42. The fastening members 60 are inserted through the fastening holes 424 of the outer die 42 and the fastening holes 416 of the inner die 41, and screwed into the threaded holes 34 of the middle die 30. In this way, the inner and outer dies 41 and 42 of the upper die unit 40A are detachably fastened to each other and detachably fastened to the top surface 31 of the middle die 30.

Figure 4:
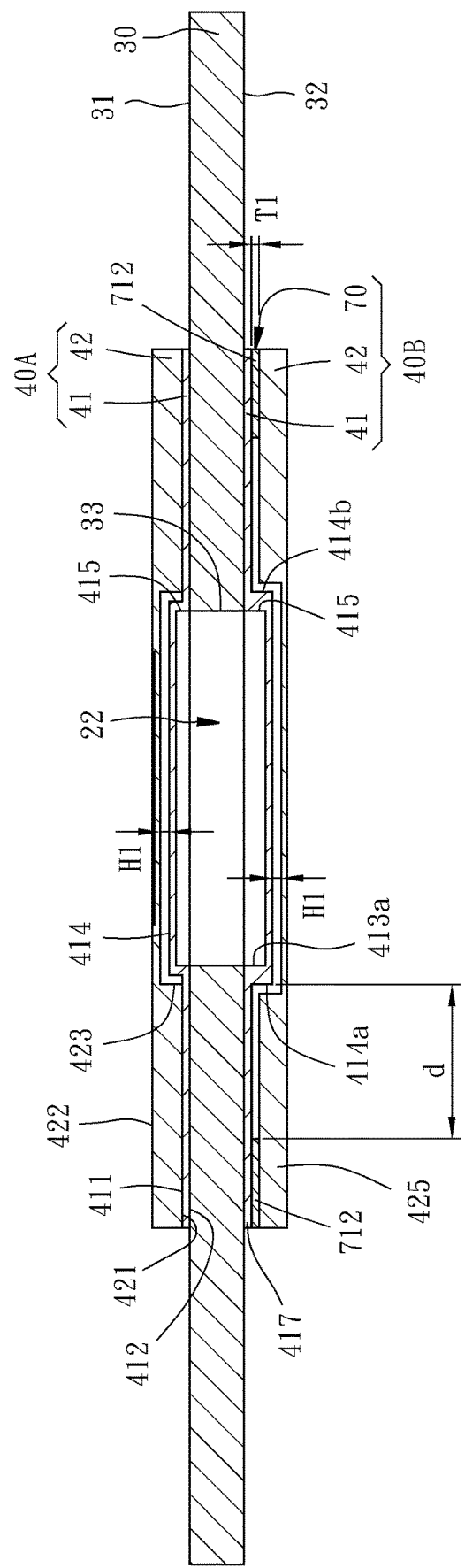
FIG. 4 and FIG. 5 are sectional views taken along the line 4-4 and the line 5-5 in FIG. 2 respectively.
Figure 5:
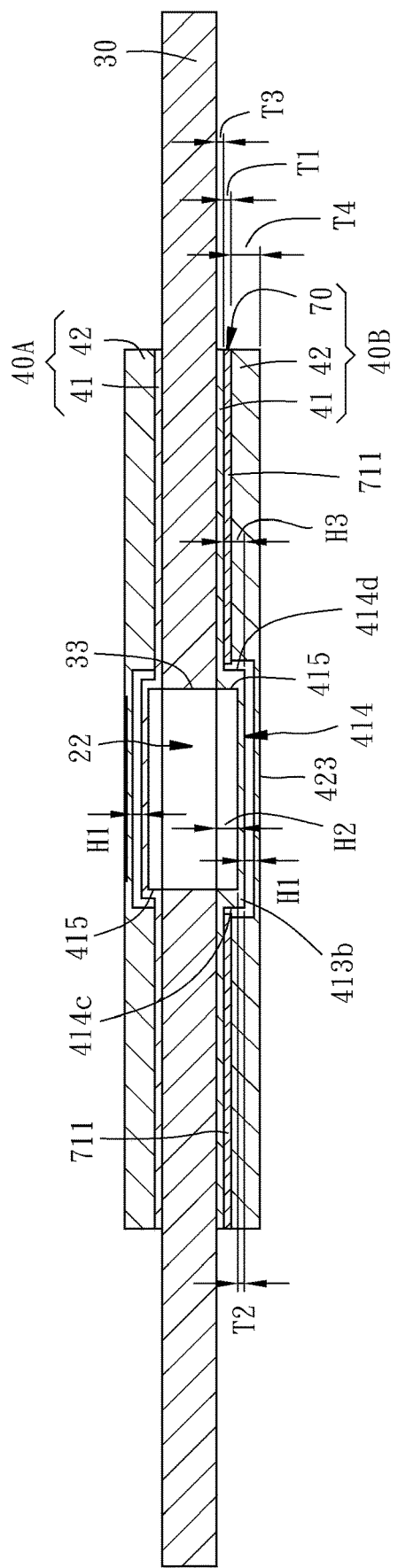

The lower die unit 40B is disposed on the bottom surface 32 of the middle die 30 in a similar way of the upper die unit 40A being disposed. The bottom surface 32 refers to the surface on the side close to the device under test. In other words, the bottom surface 32 faces toward the device under test (not shown). However, the lower die unit 40B further includes a metal heat dissipating layer 70 disposed between the inner and outer dies 41 and 42. The metal heat dissipating layer 70 is disposed between the peripheral portion 417 of the inner die 41 and the supporting portion 425 of the outer die 42. In other words, for the lower die unit 40B, the inner die 41 is connected to the bottom surface 32 of the middle die 30 by the inner connecting surface 412 and connected to the metal heat dissipating layer 70 by the outer connecting surface 411, the outer die 42 is connected to the metal heat dissipating layer 70 by the inner surface 421, and the protruding portion 414 of the inner die 41 is located in the installation recess 423 of the outer die 42. As shown in FIG. 4 and FIG. 5, there is a gap between the protruding portion 414 of the inner die 41 and the installation recess 423 of the outer die 42. The height H1 of the gap is larger than the thickness T1 of the metal heat dissipating layer 70, but unlimited thereto. For example, the height H1 of the gap may be smaller than the thickness T1 of the metal heat dissipating layer 70. The probe installation section 413 of the inner die 41 includes an insertion portion 413b, through which the probes are adapted to be inserted. The level difference portion 413a is located between the insertion portion 413b and the peripheral portion 417. The thickness T2 of the insertion portion 413b is preferably smaller than the thickness T3 of the peripheral portion 417. In this way, it can ensure the thickness T3 to maintain the supportive strength of the peripheral portion 417 and also prevent the insertion portion 413b of the probe installation section 413 from being too thick and thereby difficult to be drilled. As a result, in the condition that the depth of the probe seat is not changed, it can ensure increase of the space (thickness) for the installation of metal heat dissipating sheets, and also ensure supportive strength and easiness of being drilled. The height H2 of the level difference portion 413a of the inner die 41 is preferably larger than the height H3 of the protruding portion 414 of the inner die 41, i.e., the height of the side 414a of the protruding portion. In this way, it can ensure to obtain a relatively larger probe accommodating space 22, also ensure the increase of the space (thickness) for the installation of the metal heat dissipating sheets in the condition that the depth of the probe seat is not changed, and also coordinate with larger thickness T3 of the peripheral portion 417 and smaller thickness T2 of the insertion portion 413b of the probe installation section 413 to ensure satisfying both the supportive strength of the peripheral portion 417 and the easiness of drilling the insertion portion 413b of the probe installation section 413. For the probe installation section 413 of the inner die 41, the thickness T2 of the insertion portion 413b is preferably smaller than the height H2 of the level difference portion 413a, and the height H2 of the level difference portion 413a is preferably larger than the thickness T3 of the peripheral portion 417. The thickness T3 of the peripheral portion 417 of the inner die 41 is preferably smaller than the thickness T4 of the supporting portion 425 of the outer die 42. In this way, in the condition that the depth of the probe seat is not changed, it can ensure the increase of the space (thickness) for the installation of the metal heat dissipating sheets. The thickness T1 of the metal heat dissipating layer 70 is preferably smaller than the height H2 of the level difference portion 413a. In this way, in the condition that the depth of the probe seat is not changed, it can ensure the increase of the space (thickness) for the installation of the metal heat dissipating sheets. The thickness T1 of the metal heat dissipating layer 70 is preferably smaller than the thickness of the inner die 41, which equals to the thickness T2 of the probe installation section 413, and preferably smaller than the thickness of the outer die 42, which equals to the thickness T4 of the supporting portion 425, thereby ensuring the depth of the probe seat. The sum of the thickness T1 of the metal heat dissipating layer 70 and the thickness T3 of the peripheral portion 417 of the inner die 41 is smaller than the height H2 of the level difference portion or the height H3 of the protruding portion 414. Specifically speaking, the sum of the thickness T1 of the metal heat dissipating layer 70 and the thickness T3 of the peripheral portion 417 of the inner die 41 is smaller than the height H3 of the protruding portion 414 of the inner die 41, i.e., the height of the side 414a of the protruding portion 414. In this way, in the condition that the depth of the probe seat is not changed, it can ensure the increase of the space (thickness) for the installation of the metal heat dissipating sheets.

Figure 6:
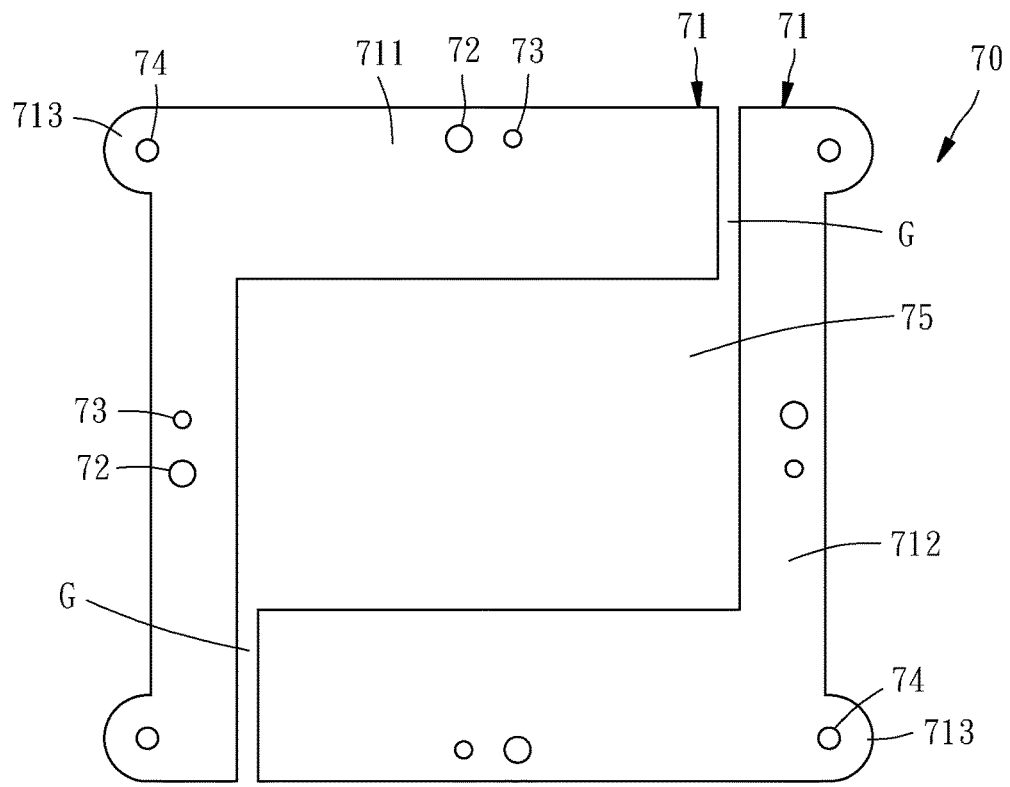
FIG. 6 is a top view of a metal heat dissipating layer of the probe seat.

The metal heat dissipating layer 70 in this embodiment includes two metal heat dissipating sheets 71 separatable from each other. The two metal heat dissipating sheets 71 are the same in shape and collectively define a space 75, which is also called hollow portion 75 hereinafter. As shown in FIG. 6, each of the metal heat dissipating sheets 71 includes a first section 711 shaped as a rectangle larger in width, a second section 712 shaped as a rectangle smaller in width and connected with the first section 711 perpendicularly, and exposed portions 713 protruding in the same direction from two ends of the second section 712 respectively, so that each metal heat dissipating sheet 71 is approximately L-shaped.

Each of the first and second sections 711 and 712 is provided with a fastening hole 72 and a through hole 73. Each of the exposed portions 713 is provided with a through hole 74. When the metal heat dissipating layer 70 is disposed between the inner and outer dies 41 and 42, the protruding portion 414 of the probe installation section 413 of the inner die 41 is located in the hollow portion 75 of the metal heat dissipating layer 70, so that the first and second sections 711 and 712 are located by four sides 414a-414d of the protruding portion 414 of the inner die 41 respectively, as shown in FIG. 4 and FIG. 5. The fastening members 60 of the lower die unit 40B are inserted through the fastening holes 424 of the outer die 42, the fastening holes 72 of the metal heat dissipating layer 70 and the fastening holes 416 of the inner die 41, and screwed into the threaded holes 35 of the middle die 30. In this way, the inner and outer dies 41 and 42 and metal heat dissipating layer 70 of the lower die unit 40B are detachably fastened to each other and detachably fastened to the bottom surface 32 of the middle die 30.

Figure 8:
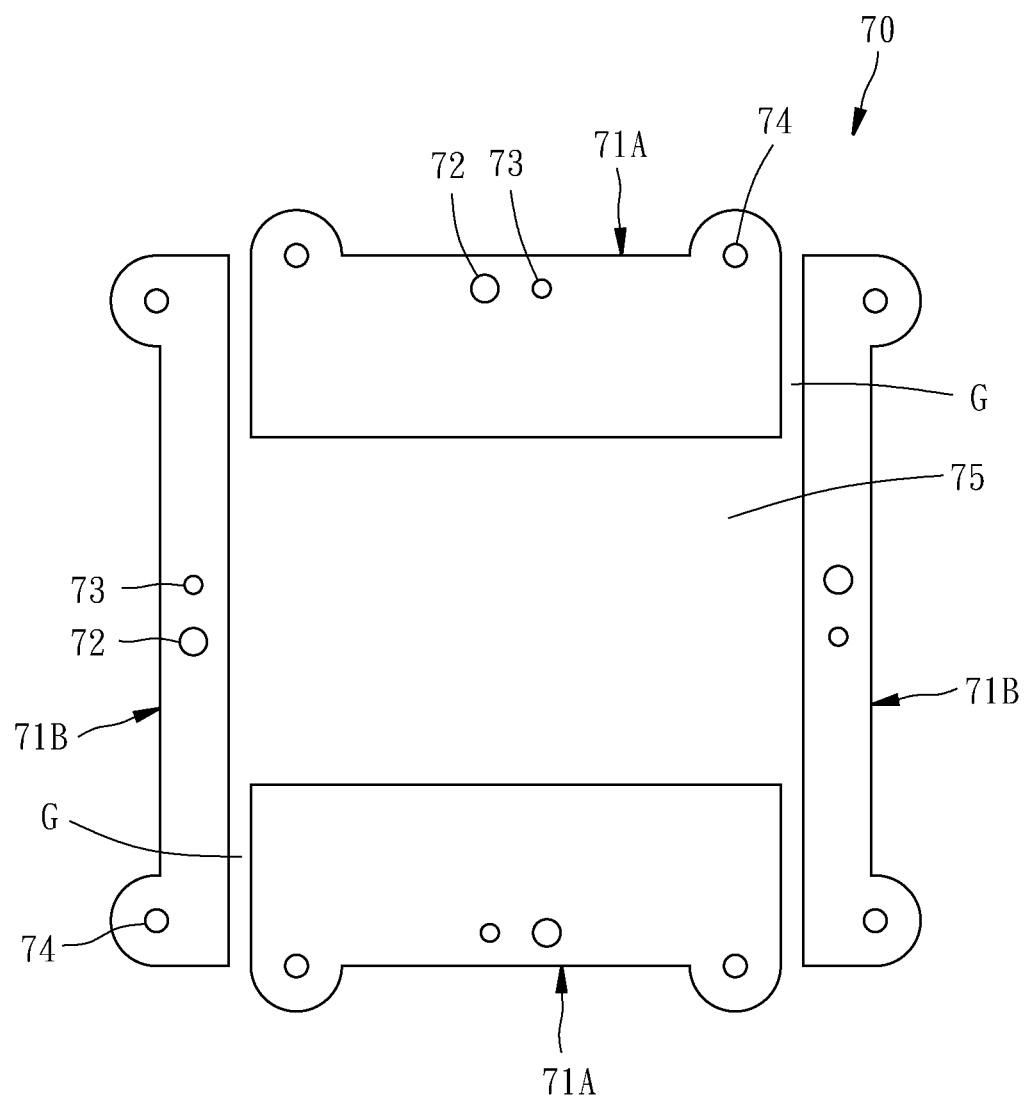
Figure 9:
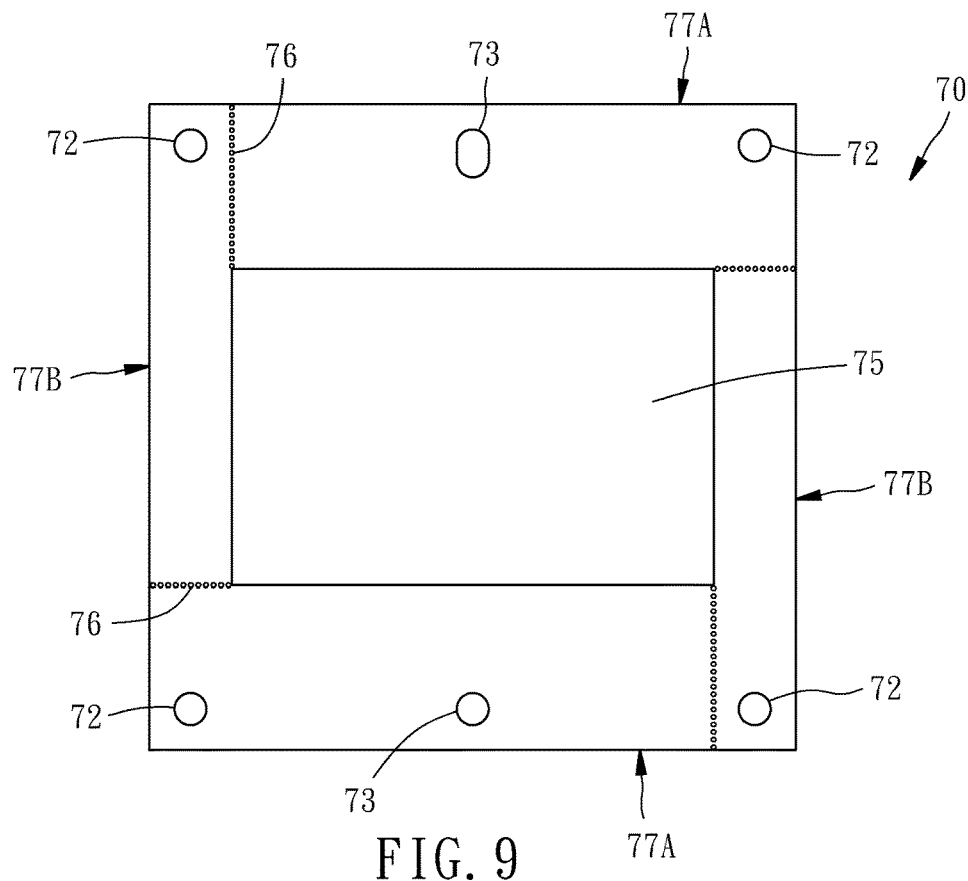
Figure 10:
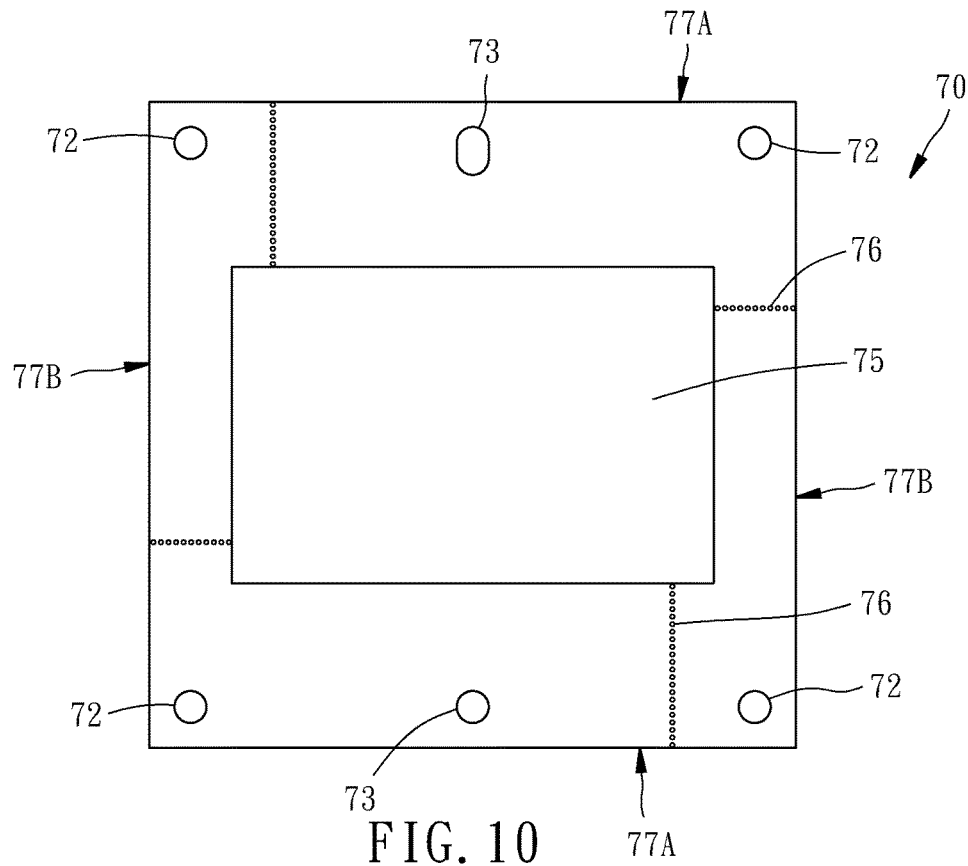
Figure 11:
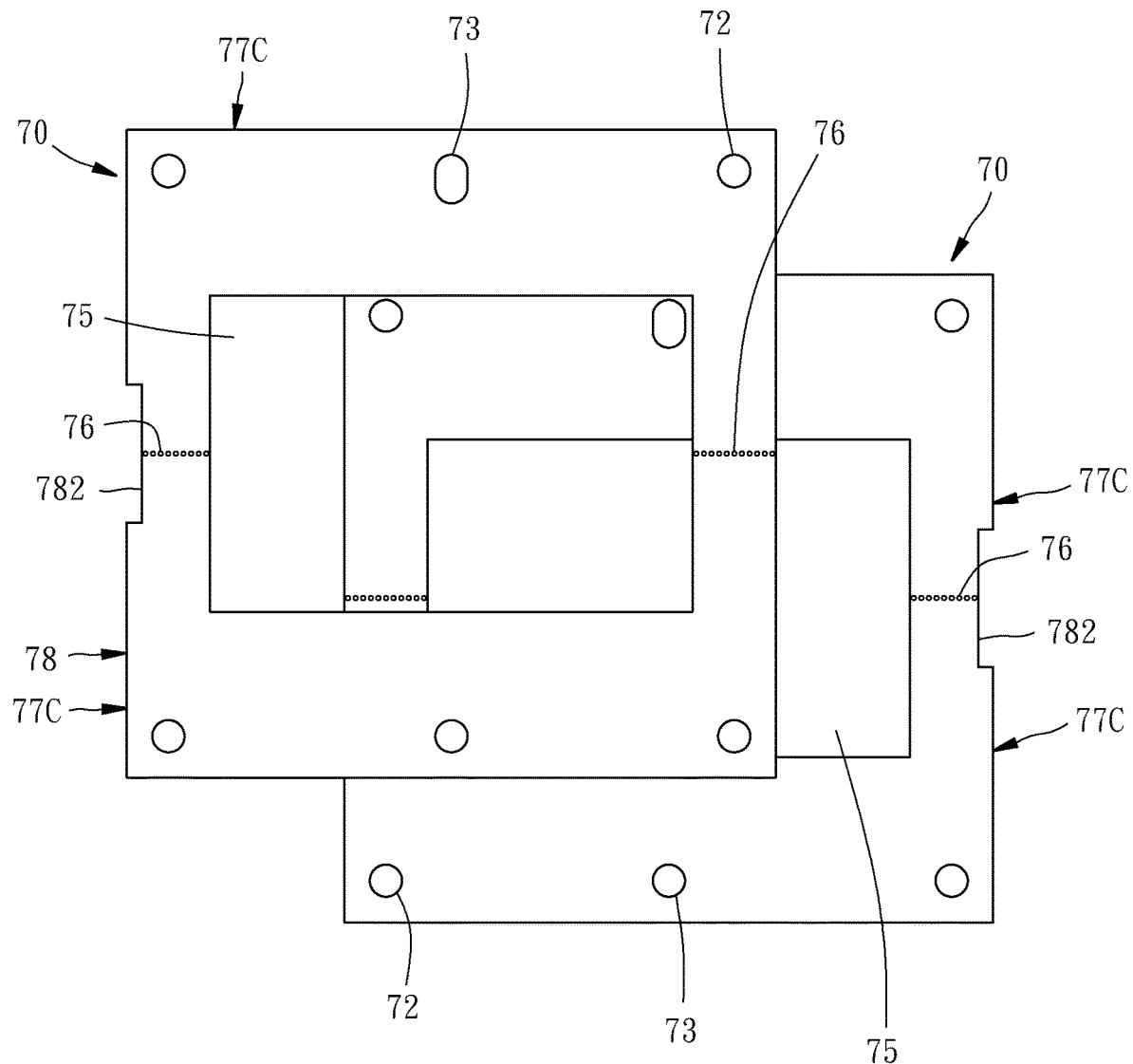
Figure 25:
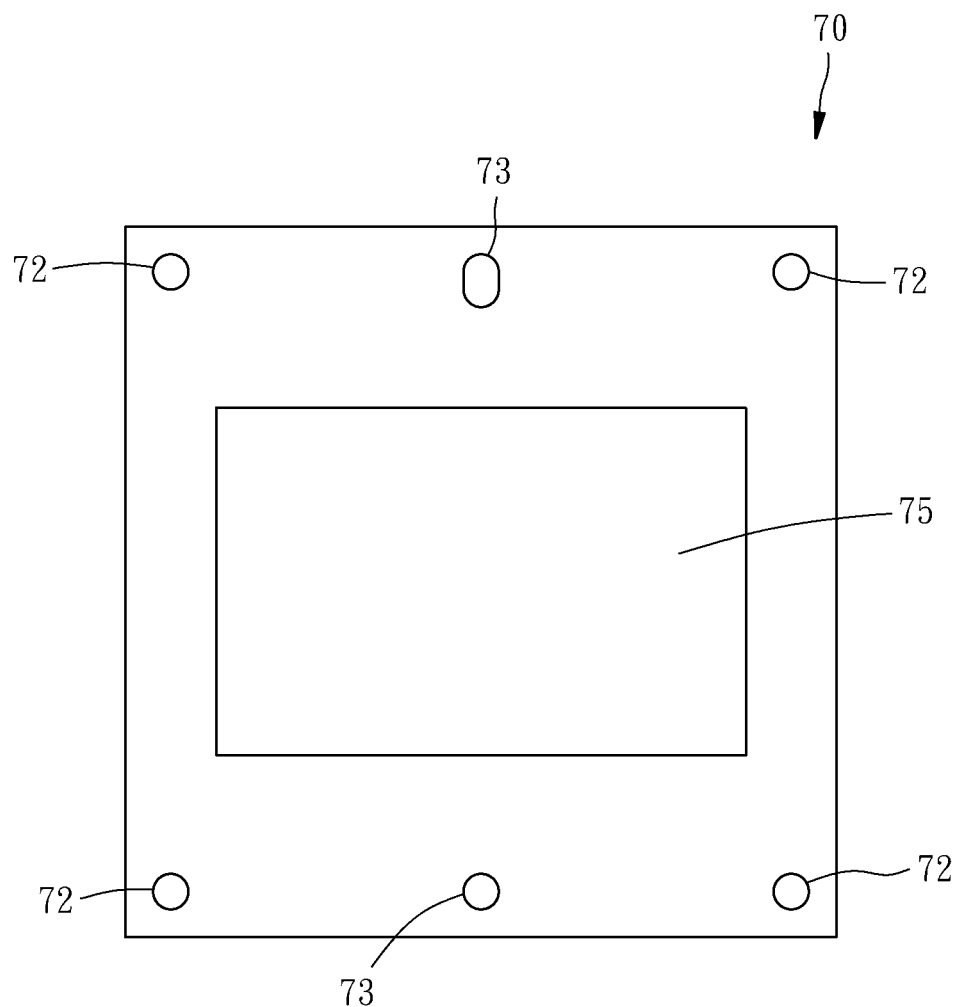
FIG. 25 is a top view of another type of metal heat dissipating layer.

It is to be mentioned that the 'a plurality of metal heat dissipating sheets separatable from each other' mentioned in the present invention includes the structural configurations as shown in FIG. 6 to FIG. 8 and FIG. 14 to FIG. 23B, wherein the metal heat dissipating sheets 71 and 71A-I are directly arranged separately from each other, which means the adjacent metal heat dissipating sheets 71 and 71A-I are provided with gaps G therebetween. The configurations, which are not shown in the drawings, that the metal heat dissipating sheets 71 and 71A-I are abutted against each other without any gap therebetween but still separatable directly are also included. Besides, the configurations shown in FIG. 9 to FIG. 11 are also included, wherein the metal heat dissipating layer 70 has tearing lines 76 and thereby can be torn by the user into a plurality of metal heat dissipating sheets 77A, 77B and 77C, which will be specified hereinbelow. However, the metal heat dissipating layer in the present invention is unlimited to include a plurality of metal heat dissipating sheets. For example, the metal heat dissipating layer 70 as shown in FIG. 25 includes only one metal heat dissipating sheet. The metal heat dissipating sheet is monolithically made with an annular shape and arranged surrounding the protruding portion 414, so that the protruding portion 414 of the probe installation section 413 of the inner die 41 is located in the space 75 surrounded by the metal heat dissipating sheet. Such metal heat dissipating layer 70 can be removed and installed when the fastening members 60 and the outer die 42 are not installed.

Figure 2:
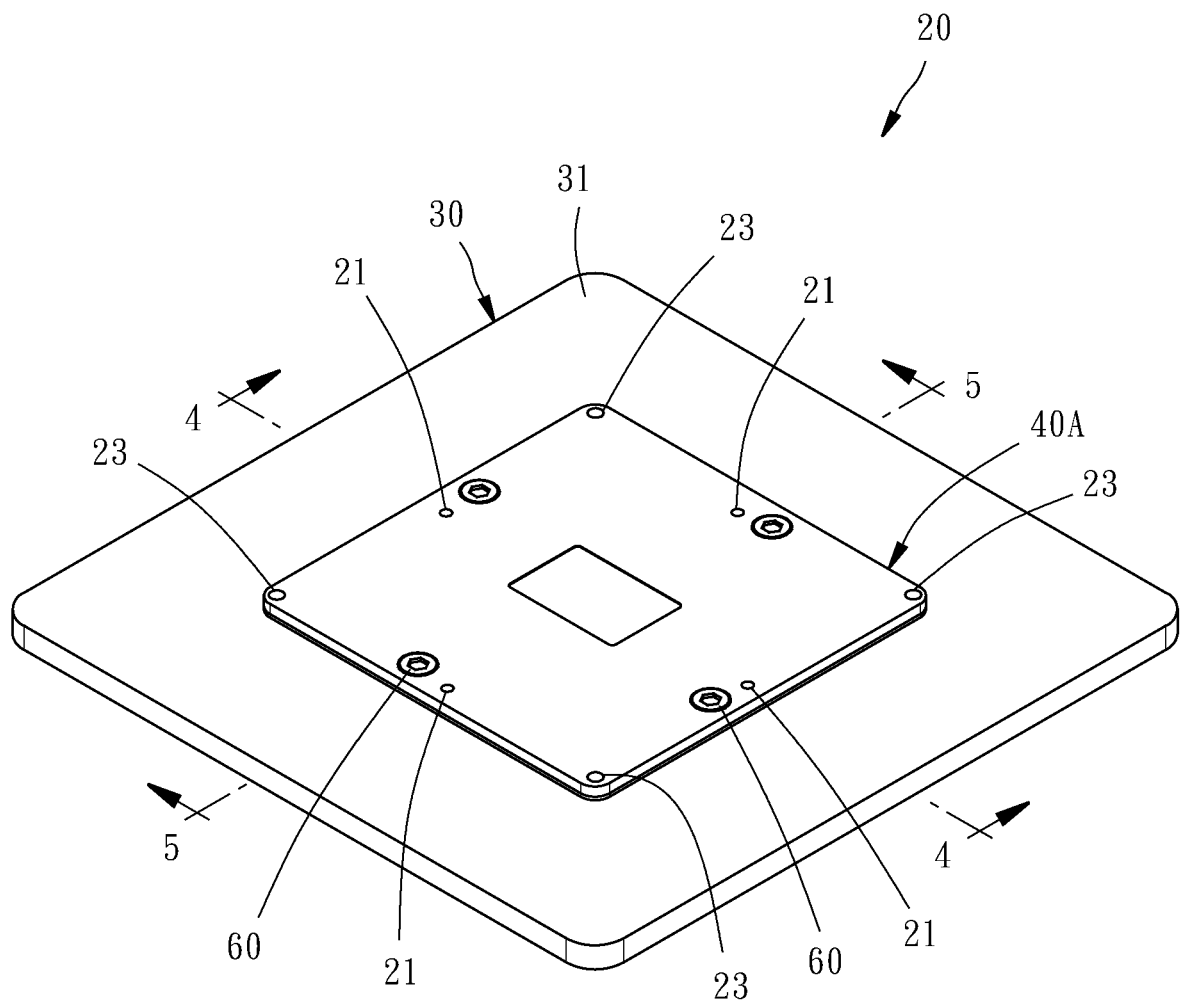
FIG. 2 and FIG. 3 are an assembled perspective view and an exploded perspective view of a probe seat according to a first preferred embodiment of the present invention respectively.
Figure 3:
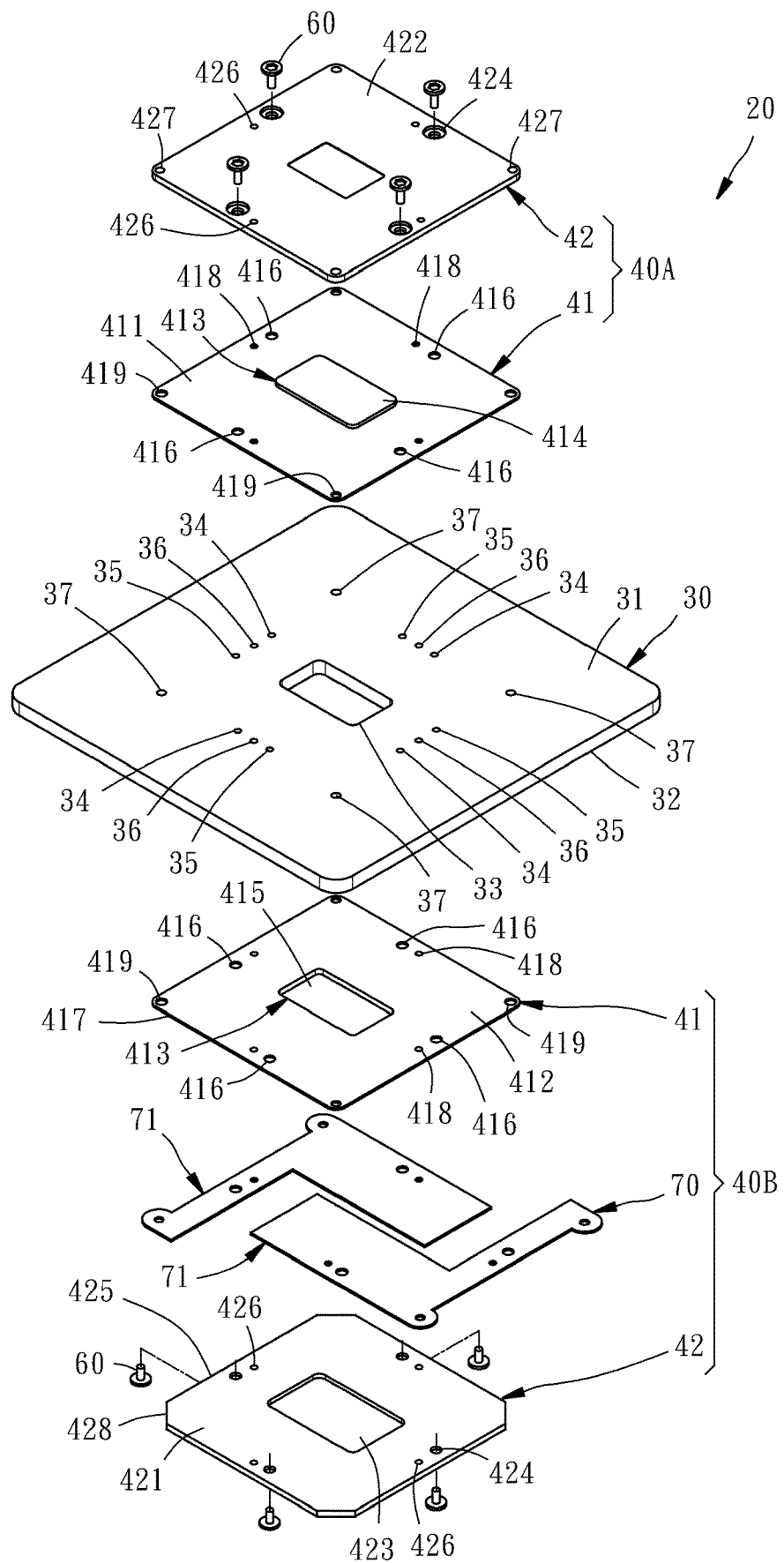

After the assembly of the probe seat 20 is accomplished in the above-described manner, the through holes 426 of the outer dies 42 and the through holes 418 of the inner dies 41 of the upper and lower die units 40A and 40B, the through holes 36 of the middle die 30, and the through holes 73 of the metal heat dissipating layer 70 collectively form four disassembly positioning holes 21, as shown in FIG. 2. Besides, the through holes 427 of the outer die 42 of the upper die unit 40A, the through holes 419 of the inner dies 41 of the upper and lower die units 40A and 40B, the through holes 37 of the middle die 30, and the through holes 74 of the metal heat dissipating layer 70 collectively form four installation positioning holes 23, as shown in FIG. 2. The outer die 42 of the lower die unit 40B is provided on four corners thereof with chamfers 428 located correspondingly to the installation positioning holes 23, so the part of each exposed portion 713 of the metal heat dissipating layer 70 provided with the installation positioning hole 23 is not connected with the outer die 42 but exposed outside.

As shown in FIG. 4 and FIG. 5, the recessed portions 415 of the inner dies 41 of the upper and lower die units 40A and 40B and the accommodating hole 33 of the middle die 30 collectively form a probe accommodating space 22. Besides, the inner dies 41 of the upper and lower die units 40A and 40B further have a plurality of inner probe holes (not shown) located in the recessed portions 415 and penetrating through the protruding portions 414. The installation recesses 423 of the outer dies 42 have a plurality of outer probe holes (not shown) communicating with the inner probe holes respectively for a plurality of probes (not shown) to be installed in the probe seat 20 by being inserted through the inner and outer probe holes of the upper and lower die units 40A and 40B and partially accommodated in the probe accommodating space 22. This part is relatively less related to the technical features of the present invention. For the simplification of the figures and the convenience of illustration, the inner and outer probe holes of the upper and lower die units 40A and 40B and the probes are not shown in the figures.

It can be known from the above description that the upper and lower die units 40A and 40B are structurally similar to each other, but in this embodiment the lower die unit 40B has the additional metal heat dissipating layer 70 when compared with the upper die unit 40A. Such structural feature makes the lower die unit 40B a heat dissipatable die unit. The dies are usually made of ceramic material, thereby having relatively lower heat conductivity. However, metal material has relatively higher heat conductivity, so the metal heat dissipating layer 70 can attain heat dissipating effect. When the probe head heated by a heat resulted from the electrical signal transmission by the probes or the heated device under test, the metal heat dissipating layer 70 can transmit the heat inside the probe head to the outer periphery of the probe head, thereby attaining the heat dissipating effect. However, the probe seat 20 of the present invention may be configured in a way that the upper die unit 40A is the aforementioned heat dissipatable die unit, or the upper and lower die units 40A and 40B are both the aforementioned heat dissipatable die units. But, the lower die unit 40B is located relatively closer to the device under test and thus heated relatively more obviously. Therefore, it can bring relatively better heat dissipating effect to make the lower die unit 40B the aforementioned heat dissipatable die unit. Besides, the probe seat 20 of the present invention is unlimited to include the middle die 30, and the one of the upper and lower die units 40A and 40B, which is not the heat dissipatable die unit, may include at least one die. From this it is knowable that the dies of the probe seat 20 of the present invention may include only the inner and outer dies 41 and 42, between which the metal heat dissipating layer 70 is disposed, and another die connected with the inner die 41, which is the middle die 30 in this embodiment. In other words, the probe seat 20 of the present invention may include at least three dies.

Figure 14:
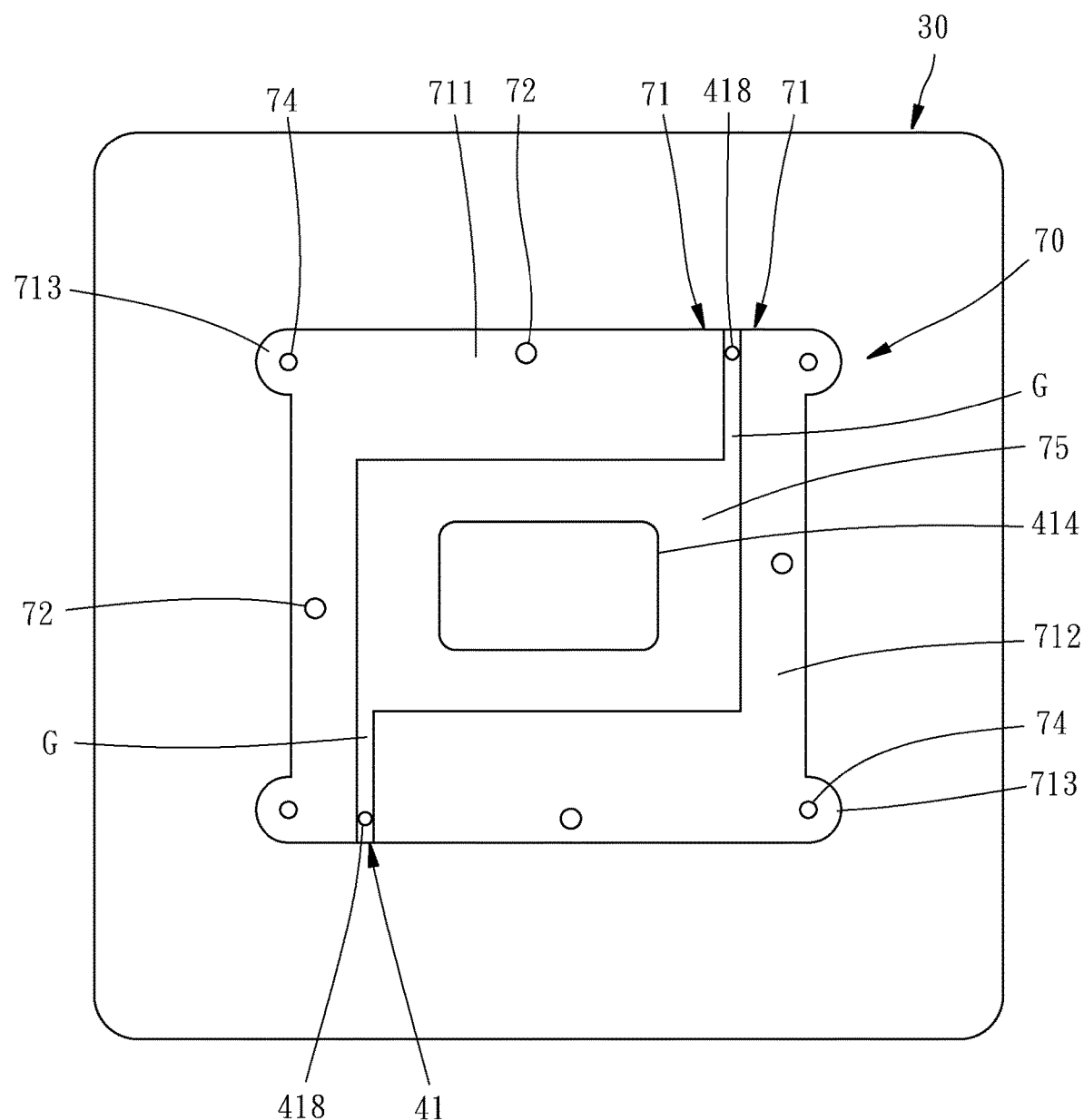
FIG. 14 is a schematic bottom view of a middle die, an inner die and a metal heat dissipating layer, which is similar to that shown in FIG. 6, of the probe seat, but showing a configuration different in positions of disassembly positioning holes.

Taking the configuration of this embodiment that the lower die unit 40B is the heat dissipatable die unit as an example, when it is required to replace the metal heat dissipating layer 70, the user can firstly dispose the probe seat 20 on a jig (not shown), and insert four positioning pins (not shown) in the four disassembly positioning holes 21 respectively to disable the dies 41, 42 and 30 from moving relative to each other in the following detaching and installing process. Then, the user can remove the fastening members 60 of the lower die unit 40B to unfasten the inner and outer dies 41 and 42 and the metal heat dissipating layer 70 of the lower die unit 40B from each other. Then, the user can insert a tool (not shown) in the through hole 74 of the exposed portion 713 of the metal heat dissipating sheet 71 through the chamfer 428 of the outer die 42 of the lower die unit 40B, so as to draw out the metal heat dissipating sheet 71 between the inner and outer dies 41 and 42. It should be mentioned here that the metal heat dissipating layer 70 in this embodiment includes two metal heat dissipating sheets 71, and the two metal heat dissipating sheets 71 can be positioned by the respective positioning pins. Therefore, before taking out one of the metal heat dissipating sheets 71, the user can remove the positioning pin inserted in the metal heat dissipating sheet 71 to enable the metal heat dissipating sheet 71 to be separated from the inner and outer dies 41 and 42 and thereby taken out. Meanwhile, the positioning pin inserted in the other metal heat dissipating sheet 71 can still prevent the dies from displacement. Alternatively, the metal heat dissipating layer 70 may be configured in a way that the metal heat dissipating sheets 71 give way to the positions the positioning pins are inserted. Thus, the metal heat dissipating sheets 71 may be not completely close, but have gaps therebetween. In other words, the disassembly positioning holes 21 are aimed at the metal heat dissipating sheets 71, such as the configuration as shown in FIG. 14, wherein the metal heat dissipating sheets 71 have no such through hole 73 as described above. The positions of the through holes 36, 418 and 426 of the dies 30, 41 and 42 for pass of the positioning pins therethrough, i.e., the positions of the disassembly positioning holes 21, aim at the gaps G between the two metal heat dissipating sheets 71, such as the positions of the two through holes 418 shown in FIG. 14, which may be located anywhere in the gaps G between the metal heat dissipating sheets 71 and unlimited in amount. In this way, it has no need to remove some positioning pins during taking out the metal heat dissipating sheets 71.

After taking out all the metal heat dissipating sheets 71, the user can directly fasten the inner and outer dies 41 and 42 to each other again by the fastening members 60 of the lower die unit 40B, such that the thickness of the probe seat 20 is reduced by the thickness of the metal heat dissipating layer 70. Alternatively, the user can install another metal heat dissipating layer 70 structurally similar to the former metal heat dissipating layer 70 between the inner and outer dies 41 and 42, then insert four other positioning pins (not shown) in the four installation positioning holes 23 respectively to accurately position the metal heat dissipating sheets 71 of the latter metal heat dissipating layer 70, and then fasten the inner and outer dies 41 and 42 and the latter metal heat dissipating layer 70 to each other by the fastening members 60 of the lower die unit 40B. By replacing different metal heat dissipating layers 70, the heat dissipating efficiency of the probe seat 20 can be modified according to requirements. It is to be mentioned that in the condition that the metal heat dissipating sheets 71 have the aforementioned through holes 73, i.e., the condition that the disassembly positioning holes 21 penetrate through the metal heat dissipating sheets 71, the disassembly positioning holes 21 can serve as the aforementioned installation positioning holes and no additional installation positioning hole is provided. However, in the configuration with the aforementioned installation positioning holes 23, the through holes 74 of the metal heat dissipating sheets 71 are not covered by the outer die 42 but visible to the user directly, such that the user can install and position the metal heat dissipating sheets 71 more easily and it is convenient to take out the metal heat dissipating sheets 71 by using the through holes 74 as described above.

Figure 7:
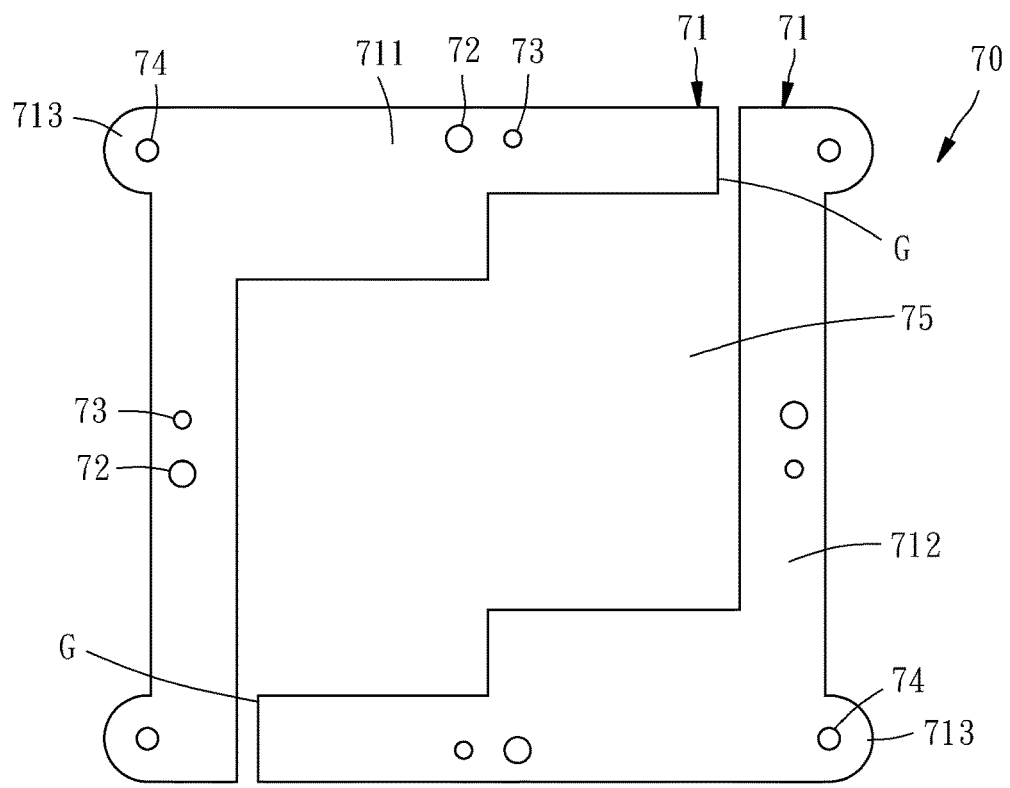
FIG. 7 to FIG. 13 are top views of various types of metal heat dissipating layers.

Because the probe installation section 413 of the inner die 41 has the protruding portion 414, the metal heat dissipating layer 70 may be configured in a way that at least a part of each of the metal heat dissipating sheets 71 is abutted against the protruding portion 414 of the inner die 41. In this way, as long as the first section 711 of the metal heat dissipating sheet 71 is abutted against the protruding portion 414, the user is aware that the metal heat dissipating sheet 71 is approximately installed at the right position. But the present invention is unlimited to the aforementioned configuration. For preventing the processing tolerance from causing interference between the metal heat dissipating sheets 71 and the protruding portion 414 of the inner die 41, each of the metal heat dissipating sheets 71 may be at least partially non-abutted against the protruding portion 414 of the inner die 41. For example, as shown in FIG. 4, in this embodiment the second sections 712 of the two metal heat dissipating sheets 71 are respectively distanced from the sides 414a and 414b of the protruding portion 414 of the inner die 41 by an interval d. Besides, as shown in FIG. 5, in this embodiment there are tiny intervals provided between the first sections 711 of the two metal heat dissipating sheets 71 and the sides 414c and 414d of the protruding portion 414 of the inner die 41 respectively. The first sections 711 of the metal heat dissipating sheets 71 may be configured to be stair-shaped as shown in FIG. 7 to reduce material cost and still have certain structural strength. The protruding portion 414 of the inner die 41 not only has the above-described effect of positioning the metal heat dissipating sheets 71, but the sides 414a-414d of the protruding portion 414 are like protective walls surrounding the probes to restrict the metal heat dissipating sheets 71 to be located around the outer periphery of the probe installation section 413 or abutted against the sides 414a-414d of the protruding portion 414 but unable to enter the probe installation section 413, such that the metal heat dissipating sheets 71 are prevented from contacting the probes when being detached or installed by the user.

Besides, for ensuring the length of the parts of the probes protruding downwardly from the bottom surface of the probe seat, the length of the probes should be provided according to the depth of the probe seat, i.e., the distance between the bottom surface of the main circuit board of the probe card and the bottom surface of the probe seat. The length of the probes will affect the high frequency property of the probes. The depth of the probe seat is restricted by the test machine. Therefore, the depth of the probe seat should be prevented from the increase resulted from the arrangement of the metal heat dissipating layer. By the configuration that the outer die 42 has the installation recess 423 and the inner die 41 has the level difference portion 413a, the inner and outer dies 41 and 42 in the present invention can be relatively smaller in thickness than the conventional ones, thereby preventing the arrangement of the metal heat dissipating layer 70 from causing the probe seat 20 too large depth to meet the requirement. In other words, the heat dissipatable die unit of the present invention can not only lower the affection of heat on the deformation of the dies, but also enable the probe seat to be maintained with the required depth to meet the requirement of the test machine and avoid the change of the required length of the probes.

The above-described way to take out or replace the metal heat dissipating layer 70 is fast, simple and convenient for the user to modify the heat dissipating effect of the probe seat 20. The dies or probes need not to be detached in the above-described modifying process, so the process has high efficiency and the operating range of the probes is prevented from change and thereby ensures identical probing performance. The metal heat dissipating sheets 71 can be made in a high accuracy processing manner, so that the depth of the probe seat 20 can be maintained accurately, and the metal heat dissipating sheets 71 can be provided with great structural strength to improve the structural strength of the whole probe seat 20.

It can be known from the above description that the present invention attains the heat dissipating effect by the arrangement of the metal heat dissipating layer 70 between the inner and outer dies 41 and 42 of at least one of the upper and lower die units 40A and 40B. The metal heat dissipating layer 70 in the present invention is arranged surrounding the protruding portion 414 of the inner die 41, not U-shaped or other configurations with one or a plurality of open sides. Therefore, the metal heat dissipating layer 70 in the present invention can bring great support between the inner and outer dies 41 and 42 and prevent the probe seat 20 from uneven thickness. In the configurations shown in FIG. 6 and FIG. 7, the metal heat dissipating layers 70 are each approximately shaped as a square ring and composed of two metal heat dissipating sheets 71 for the user to take out or replace the metal heat dissipating sheets 71 without detaching the dies of the probe seat 20. The amount and positional distribution of the metal heat dissipating sheets 71 of the metal heat dissipating layer 70 are unlimited and adjustable according to requirements. For example, the metal heat dissipating layer 70 as shown in FIG. 8 includes four metal heat dissipating sheets 71A and 71B, the shapes of which are configured like dividing the first and second sections 711 and 712 of the metal heat dissipating sheet 71 shown in FIG. 6 into different metal heat dissipating sheets 71A and 71B. When the metal heat dissipating layer 70 as shown in FIG. 8 is disposed between the inner and outer dies 41 and 42, the four metal heat dissipating sheets 71A and 71B are located by four sides 414a-414d of the protruding portion 414 of the inner die 41 respectively.

The metal heat dissipating layers 70 as shown in FIG. 6 to FIG. 8 and FIG. 14 to FIG. 23B are each composed of a plurality of metal heat dissipating sheets originally separatable from each other directly, so that after removing the fastening members 60, the user can directly take out the metal heat dissipating sheets and can install a different metal heat dissipating layer 70. However, in the condition that it requires to take out the metal heat dissipating layer 70 only but install no more metal heat dissipating layer 70, the metal heat dissipating layer 70 in the present invention may be made monolithically and shaped annularly. For example, the metal heat dissipating layers 70 as shown in FIG. 9 to FIG. 11 are each shaped as a monolithic square ring and provided with a plurality of tearing lines 76 made by preformed perforations. The tearing lines 76 divide the metal heat dissipating layer 70 into a plurality of metal heat dissipating sheets. The amount and positional distribution of the tearing lines 76 and the metal heat dissipating sheets are unlimited and adjustable according to requirements. For example, the metal heat dissipating layers 70 as shown in FIG. 9 and FIG. 10 both include four tearing lines 76, and four metal heat dissipating sheets 77A and 77B defined by the tearing lines 76. However, the metal heat dissipating layers 70 as shown in FIG. 9 and FIG. 10 are different in the positional distribution of the tearing lines 76 and the metal heat dissipating sheets 77A and 77B. The metal heat dissipating layer 70 as shown in FIG. 11 includes only two tearing lines 76, and two metal heat dissipating sheets 77C defined by the two tearing lines 76. When it is required in application to remove the metal heat dissipating layer 70, after removing the fastening members 60, the user can tear the metal heat dissipating layer 70 along the tearing lines 76 to separate the originally monolithically connected metal heat dissipating sheets from each other, and then take out the metal heat dissipating sheets.

The probe seat 20 of the present invention may include a plurality of metal heat dissipating layers 70 disposed between the inner and outer dies 41 and 42 at the same time, so that the user can draw out the metal heat dissipating layer 70 for multiple times. For example, two metal heat dissipating layers 70 for being disposed between the inner and outer dies 41 and 42 at the same time are shown in FIG. 11, wherein each of the metal heat dissipating layers 70 is provided on the outer periphery 78 thereof with an indentation 782 adjoining one of the tearing lines 76. The indentations 782 of the adjacent metal heat dissipating layers 70 are not aimed at each other. Such configuration is convenient for the user to tear one metal heat dissipating layer 70 and take it out.

Figure 12:
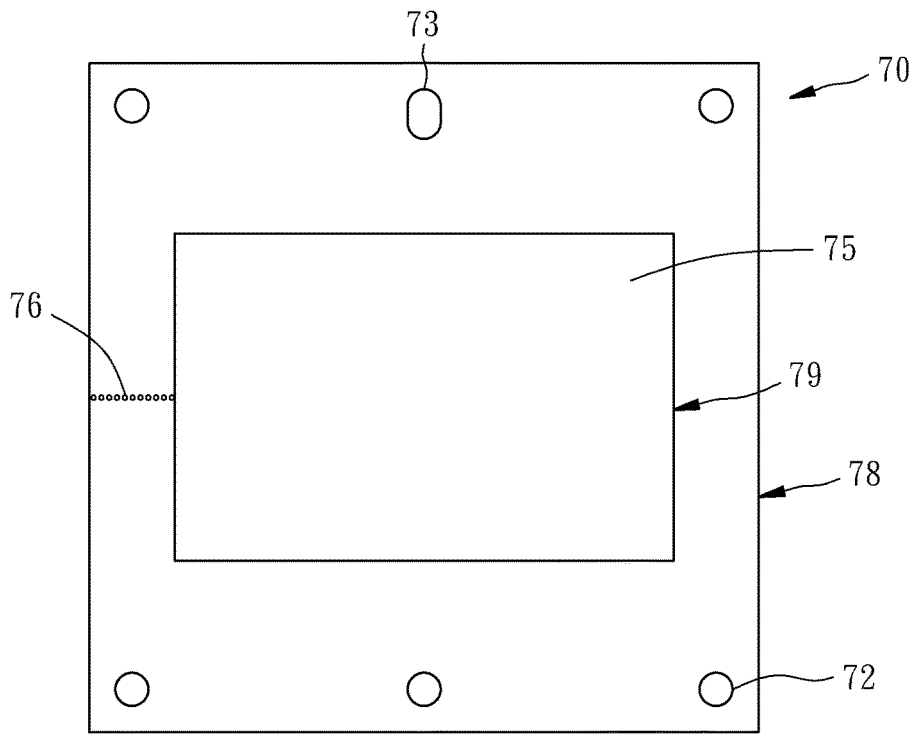
Figure 13:
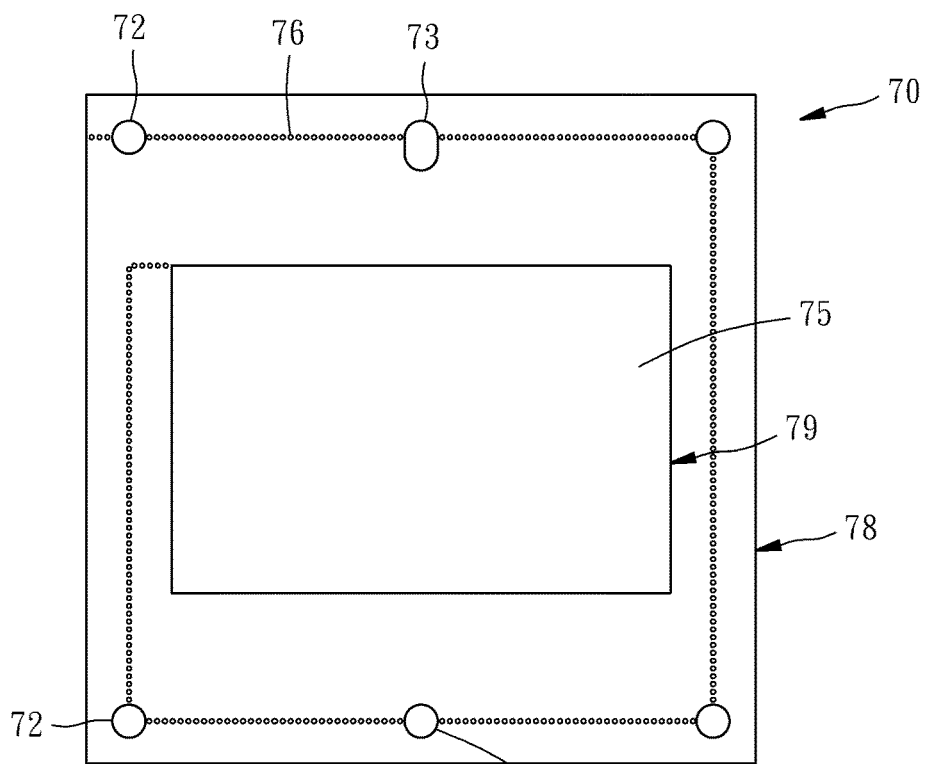

Referring to FIG. 12 and FIG. 13, the metal heat dissipating layers 70 shown therein are similar to the metal heat dissipating layers 70 as shown in FIG. 9 to FIG. 11, which are each made monolithically and shaped annularly to define a hollow portion 75, but the metal heat dissipating layers 70 as shown in FIG. 12 and FIG. 13 each include only one tearing line 76. The tearing line 76 extends from an inner periphery 79 of the metal heat dissipating layer 70, which defines the hollow portion 75, to the outer periphery 78. In FIG. 12, the tearing line 76 of the metal heat dissipating layer 70 is provided at the position where no fastening hole 72 or through hole 73 is provided. In FIG. 13, the tearing line 76 of the metal heat dissipating layer 70 passes through the fastening holes 72 of the metal heat dissipating layer 70 for insertion of the fastening members 60 therethrough and the through holes 73 for insertion of the positioning pins therethrough, which means it passes through the aforementioned disassembly positioning holes 21. In this way, the user can tear the metal heat dissipating layer 70 along the tearing line 76 to take out the metal heat dissipating layer 70 between the inner and outer dies 41 and 42.

Figure 15:
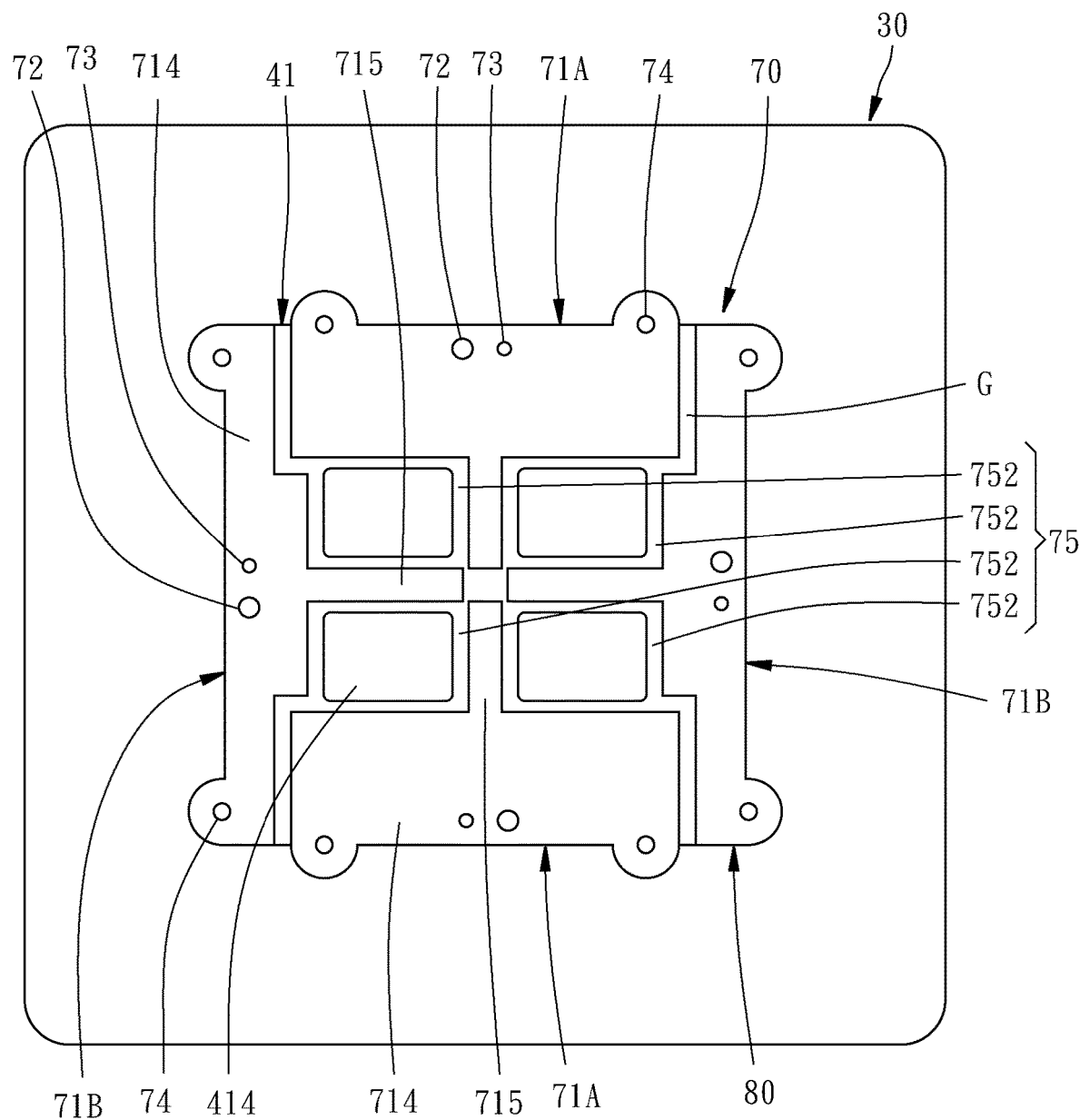
FIG. 15 is a bottom view of a middle die, an inner die and a metal heat dissipating layer of a probe seat according to a second preferred embodiment of the present invention.

The above-described various types of metal heat dissipating layers 70 provided by the present invention may be modified in a manner described below, thereby applicable to the probe head of a multi-DUT probe card for testing a plurality of devices under test at the same time. For example, in a second preferred embodiment of the present invention as shown in FIG. 15, the metal heat dissipating layer 70 is similar to the metal heat dissipating layer 70 as shown in FIG. 8. They are primarily different in that each of the metal heat dissipating sheets 71A and 71B shown in FIG. 15 includes not only a main section 714 similar to the metal heat dissipating sheet shown in FIG. 8, but also a strengthening rib 715 connected with the main section 714 monolithically. The main sections 714 form a peripheral unit 80 defining the hollow portion 75, which means the metal heat dissipating sheets of a same metal heat dissipating layer 70 shown in FIG. 6 to FIG. 14 form a peripheral unit. The strengthening ribs 715 extend from the peripheral unit 80 toward the hollow portion 75 to divide the hollow portion 75 into four regions 752. Such metal heat dissipating layer 70 is adapted for the probe card for testing four devices under test at the same time. In such condition, the inner die 41 is provided with four protruding portions 414, which means the probe head has four probe installation sections for the installation of the probes for probing the four devices under test respectively. The metal heat dissipating layer 70 shown in FIG. 15 is adapted for receiving the four protruding portions 414 in the four regions 752 respectively, thereby attaining great supporting effect and still enabling the user to remove or replace the metal heat dissipating layer 70. It is to be mentioned that in the practical application, the aforementioned features such as the strengthening ribs 715, the regions 752 and the protruding portions 414 are unnecessary to be sized according to the scale proportion as shown in FIG. 15. The probes disposed on the adjacent protruding portions 414 may be used to probe the adjacent devices under test. Alternatively, there may be one or a plurality of other devices under test located between the devices under test probed by the probes disposed on the adjacent protruding portions 414, which is the test method commonly known as skipping DUT.

The above-described metal heat dissipating layer 70 shown in FIG. 15 is composed of T-shaped metal heat dissipating sheets 71A and 71B. However, the above-described metal heat dissipating layer 70 including the strengthening rib 715 may be composed of metal heat dissipating sheets of other shapes, e.g., L-shape, I-shape, and so on, such as the configurations as shown in FIG. 16 to FIG. 20. The metal heat dissipating layer 70 shown in FIG. 16 includes two metal heat dissipating sheets 71C and two metal heat dissipating sheets 71D. Each of the metal heat dissipating sheets 71C includes a first section 716 and a second section 717, which are monolithically connected with each other into an L-shape. Each of the metal heat dissipating sheets 71D includes a third section 718 and a strengthening rib 715, which are monolithically connected with each other into an L-shape. The first sections 716 of the two metal heat dissipating sheets 71C are located adjacent to the third sections 718 of the two metal heat dissipating sheets 71D respectively, and the second sections 717 of the two metal heat dissipating sheets 71C are located adjacent to the strengthening ribs 715 of the two metal heat dissipating sheets 71D respectively, so that the first, second and third sections 716, 717 and 718 form a peripheral unit 80 defining a hollow portion 75, and the strengthening ribs 715 of the two metal heat dissipating sheets 71D extend from the peripheral unit 80 toward the hollow portion 75 to divide the hollow portion 75 into two regions 752. Each of the regions 752 may be provided therein with one or a plurality of protruding portions 414. For example, in FIG. 16, each of the regions 752 is provided therein with three protruding portions 414, which means the inner die 41 has six protruding portions 414, and so do the inner dies 41 shown in FIG. 17 to FIG. 20. Such configuration is applicable to the probe card for testing six devices under test at the same time.

Figure 16:
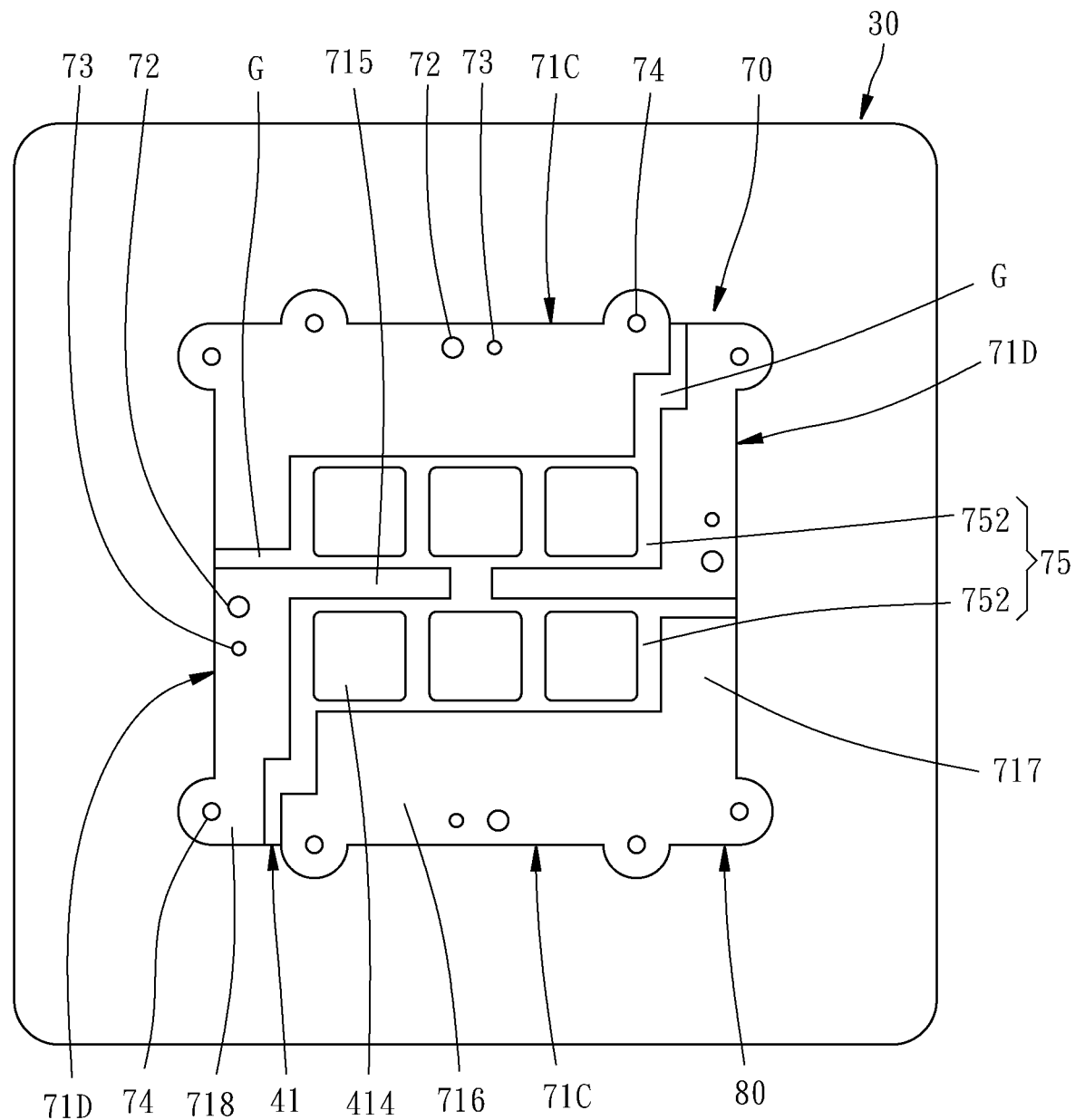
FIG. 16 to FIG. 20 are similar to FIG. 15, but showing various types of metal heat dissipating layers.
Figure 17:
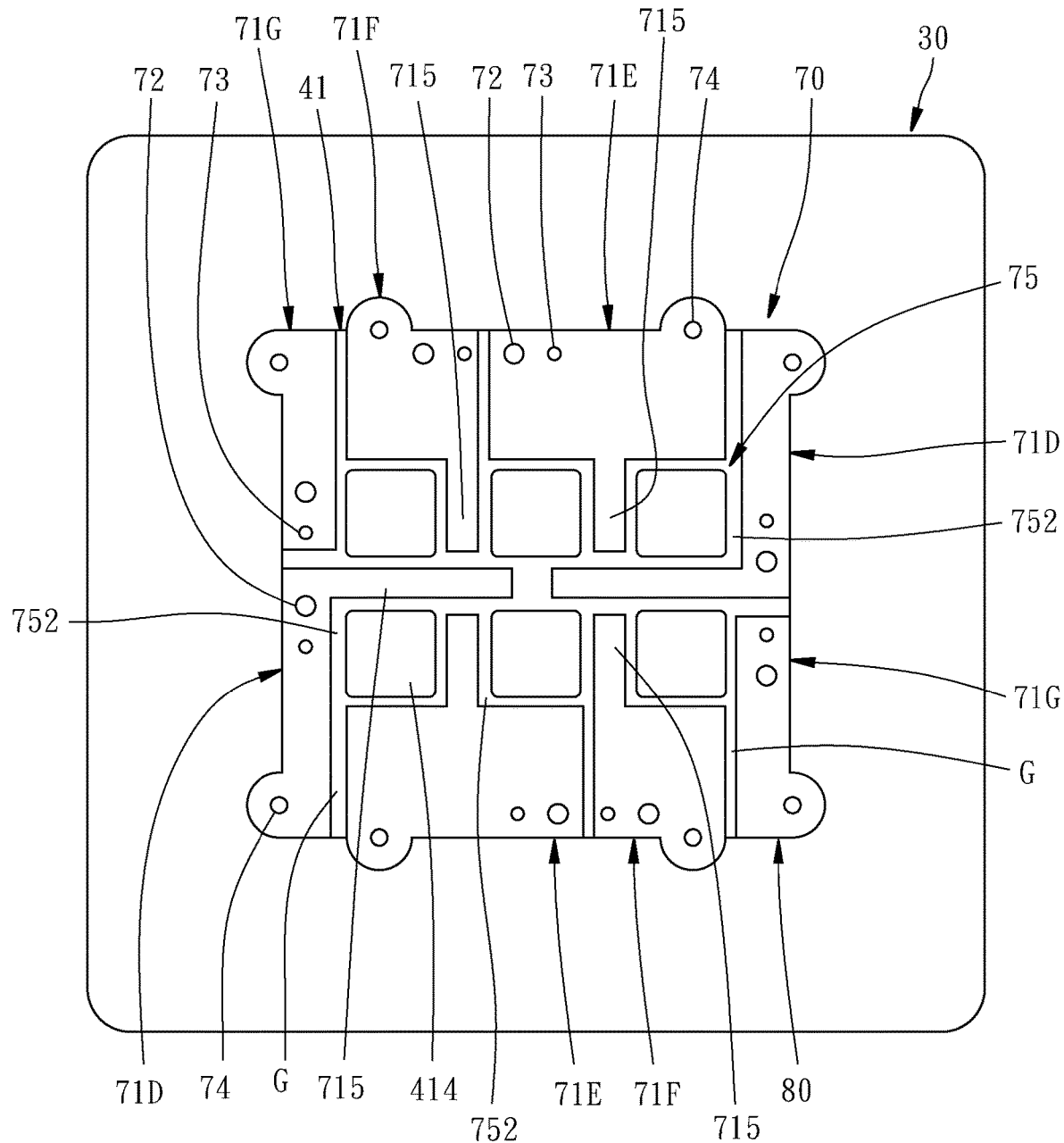

The metal heat dissipating layer 70 shown in FIG. 17 is similar to the metal heat dissipating layer 70 shown in FIG. 16, but the metal heat dissipating layer 70 shown in FIG. 17 is configured in a way that the metal heat dissipating sheets 71C shown in FIG. 16 are each replaced by metal heat dissipating sheets 71E, 71F and 71G, which are T-shaped, L-shaped and I-shaped respectively. In other words, the metal heat dissipating layer 70 shown in FIG. 17 includes eight metal heat dissipating sheets 71D, 71E, 71F and 71G, wherein not only the metal heat dissipating sheet 71D includes the strengthening rib 715, but the metal heat dissipating sheets 71E and 71F also include the strengthening rib 715. Therefore, the metal heat dissipating layer 70 includes six strengthening ribs 715 extending from the peripheral unit 80 toward the hollow portion 75 to divide the hollow portion 75 into six regions 752. The six protruding portions 414 of the inner die 41 are located in the six regions 752 respectively.

Figure 18:
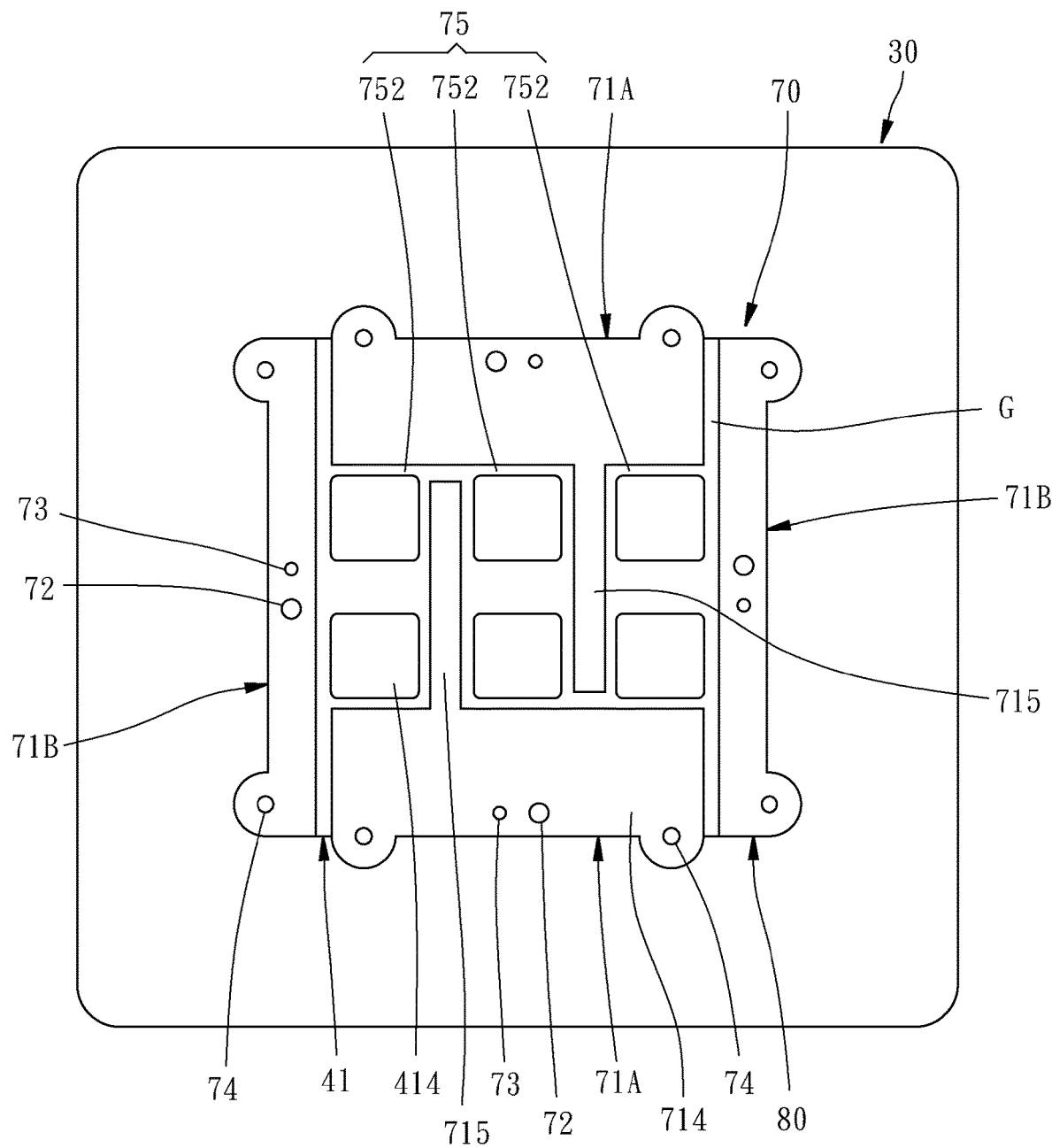

The metal heat dissipating layer 70 shown in FIG. 18 is similar to the metal heat dissipating layer 70 shown in FIG. 8, but the primary difference therebetween is that each of the metal heat dissipating sheets 71A shown in FIG. 18 includes not only a main section 714 similar to the metal heat dissipating sheet 71A shown in FIG. 8, but also a strengthening rib 715 monolithically connected with the main section 714. That means each of the metal heat dissipating sheets 71A is approximately T-shaped, but the strengthening rib 715 is deviated to a side of the main section 714, not located at the center of the main section 714. Each of the metal heat dissipating sheets 71B includes no strengthening rib 715 and thereby I-shaped, so the metal heat dissipating layer 70 includes only two strengthening ribs 715 extending from the peripheral unit 80 toward the hollow portion 75 to divide the hollow portion 75 into three regions 752. Each of the regions 752 is provided therein with two protruding portions 414.

Figure 19:
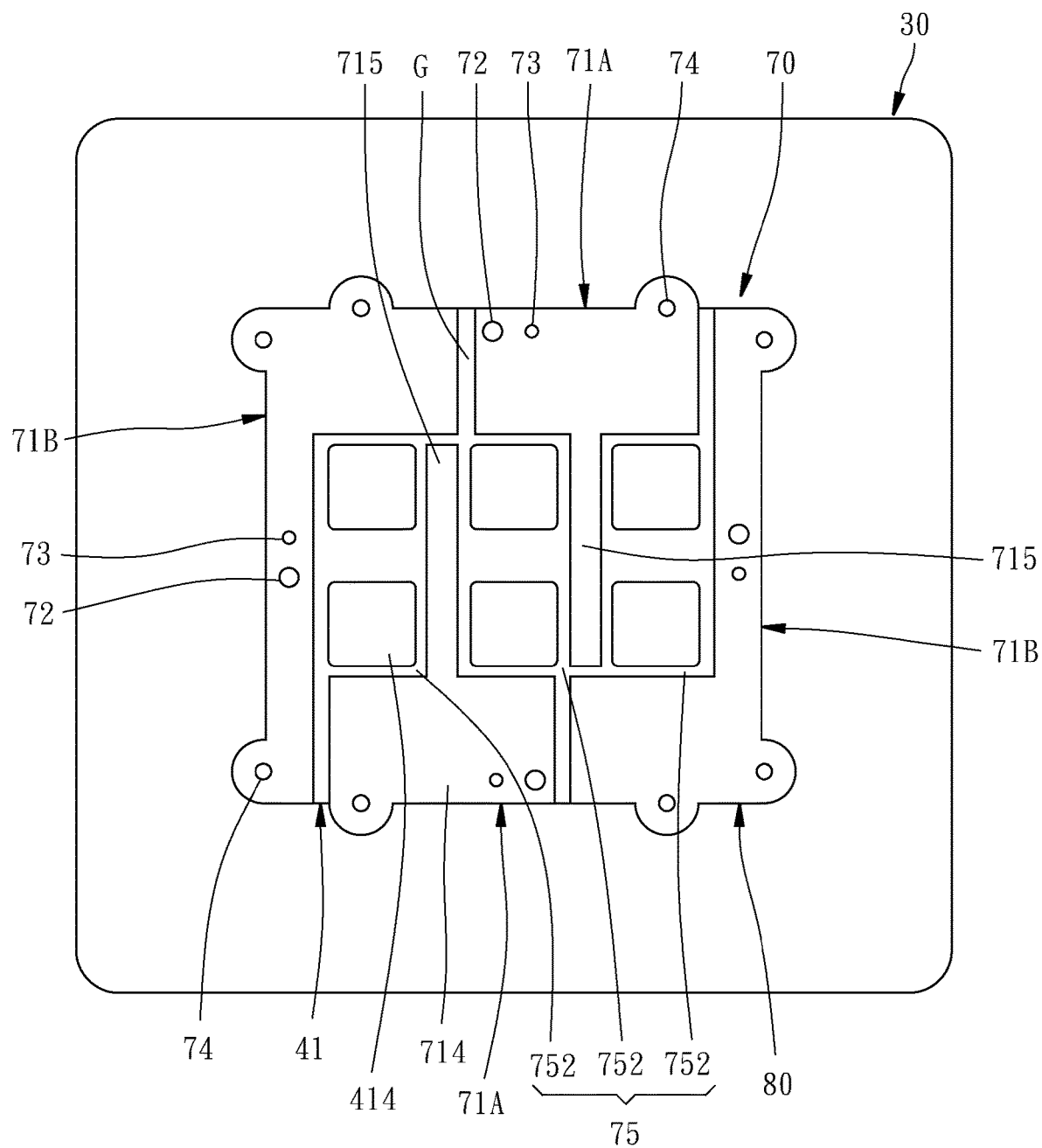

The metal heat dissipating layer 70 shown in FIG. 19 is similar to the metal heat dissipating layer 70 shown in FIG. 18, but in FIG. 19 the main section 714 of the metal heat dissipating sheet 71A has relatively smaller area and the metal heat dissipating sheet 71B has an additional section extending toward the metal heat dissipating sheet 71A, so that the metal heat dissipating sheet 71B is L-shaped.

Figure 20:
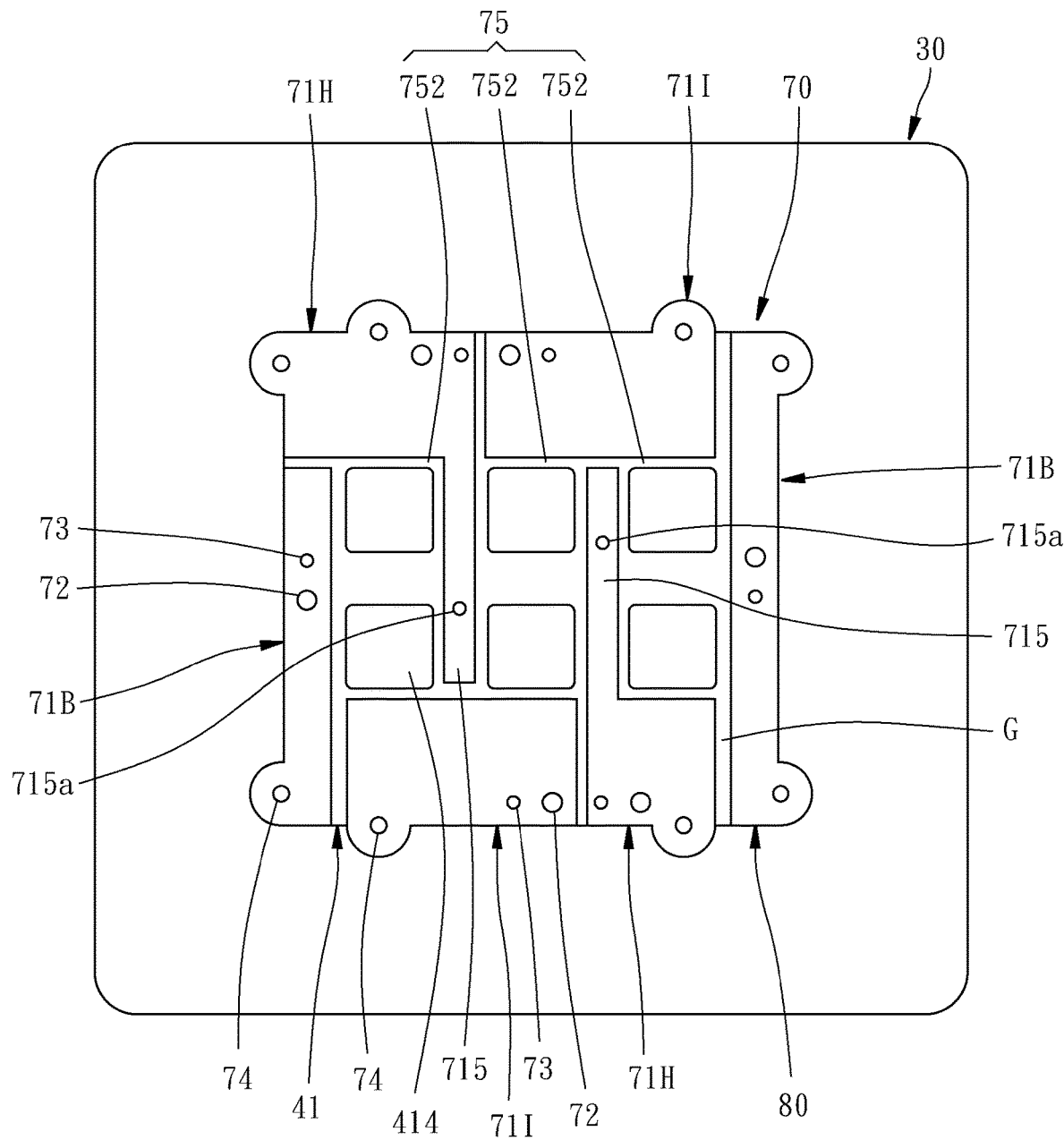

The metal heat dissipating layer 70 shown in FIG. 20 is also similar to the metal heat dissipating layer 70 shown in FIG. 18, but the metal heat dissipating layer 70 shown in FIG. 20 is configured in a way that the T-shaped metal heat dissipating sheets 71A shown in FIG. 18 are each replaced by metal heat dissipating sheets 71H and 711, which are L-shaped and I-shaped respectively. In other words, the metal heat dissipating layer 70 shown in FIG. 20 includes two L-shaped metal heat dissipating sheets 71H and four I-shaped metal heat dissipating sheets 71B and 711.

The above-described various types of metal heat dissipating layers 70 can attain great supporting effect by the strengthening ribs 715 extending from the peripheral unit 80 toward the hollow portion 75, and the user can still remove or replace the metal heat dissipating layer 70. Besides, the strengthening ribs 715 located in the hollow portion 75 can directly transmit the heat inside the probe head outwardly, which can further improve the heat dissipating effect. In addition, the strengthening ribs 715 are also effective in enhancing the structural strength. Especially, in the aforementioned test method commonly known as skipping DUT, the adjacent protruding portions 414 are distanced from each other relatively farther and thereby more possible to cause the problem of insufficient strength. The strengthening ribs 715 of the metal heat dissipating layer 70 can extend between the adjacent protruding portions 414 to strengthen the support. Besides, under the tendency to large dies, the die with large area is liable to have bent deformation at the center thereof. In such condition, the strengthening ribs 715 of the metal heat dissipating layer 70 can be further provided with fastening holes for pass of screws therethrough, such as the fastening holes 715a as shown in FIG. 20, so that the strengthening ribs 715 can be fastened to the inner and outer dies 41 and 42 by screws to prevent the center of the dies from bent deformation.

As described above, by means of the arrangement of the disassembly positioning holes 21 at the positions not aimed at the metal heat dissipating sheets 71, it is unnecessary to remove some positioning pins during taking out the metal heat dissipating sheets 71, thereby achieving the convenience of removing the metal heat dissipating sheets 71. The aforementioned positions that are not aimed at the metal heat dissipating sheets 71 are unlimited to the positions corresponding to the gaps G between the metal heat dissipating sheets 71 as shown in FIG. 14, as long as interference with the path of removing the metal heat dissipating sheets can be avoided.

Figure 21:
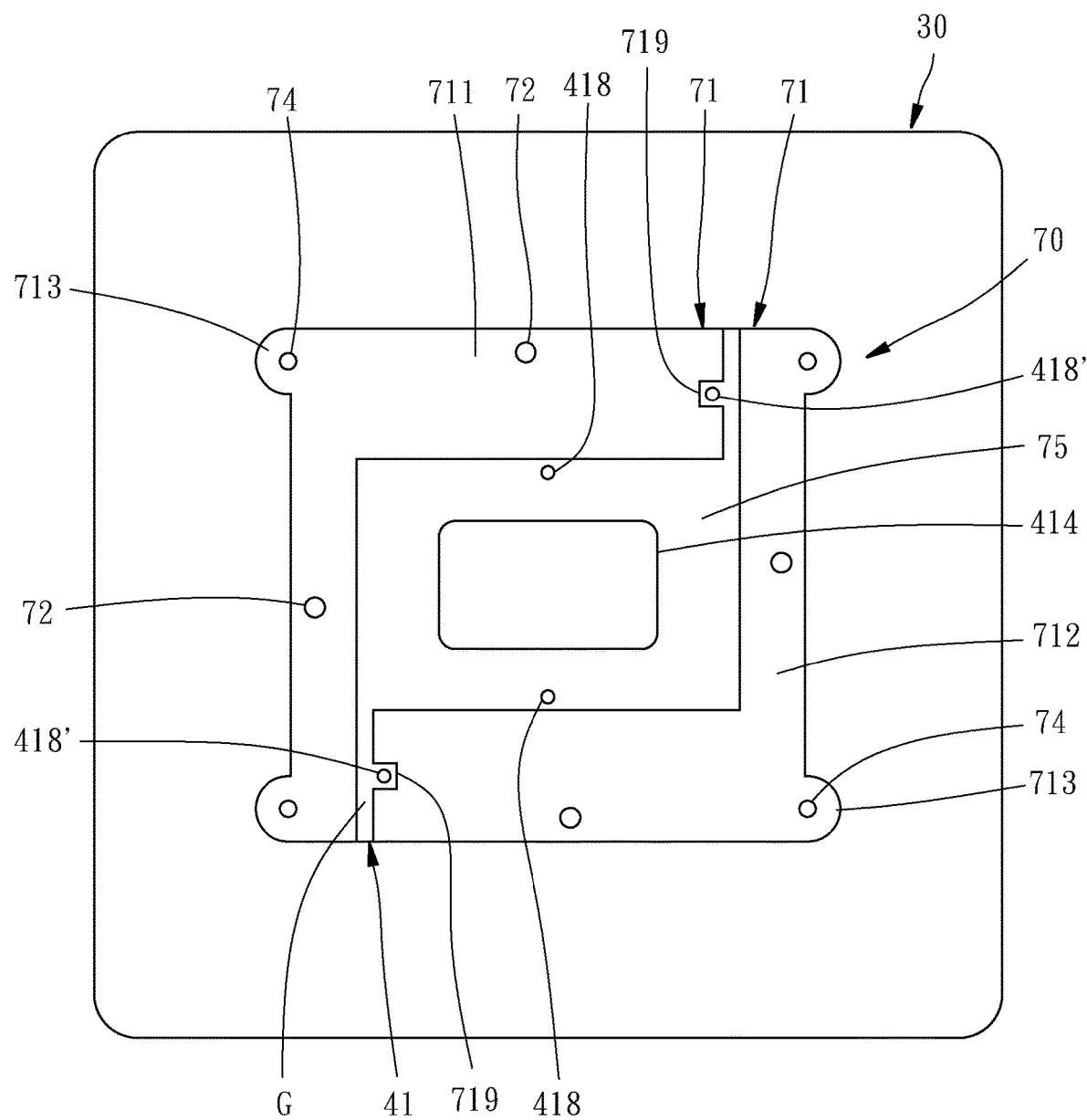
FIG. 21 and FIG. 22 are similar to FIG. 14 and FIG. 16 respectively, but showing configurations different in positions of disassembly positioning holes.

Taking the configuration similar to the metal heat dissipating layer shown in FIG. 14 for example, as shown in FIG. 21, the disassembly positioning holes 21 may be located correspondingly to the positions between the metal heat dissipating sheets 71 and the protruding portion 414, i.e., aimed at the space 75, such as the positions of the two through holes 418 shown in FIG. 21. That is, the disassembly positioning holes 21 can be anywhere between the metal heat dissipating sheets 71 and the protruding portion 414 and unlimited in amount. Alternatively, as shown in FIG. 21, the metal heat dissipating sheet 71 may have a notch 719 opened toward another metal heat dissipating sheet 71. The disassembly positioning hole 21 may be located correspondingly to the notch 719, i.e., located at the positions of the two through holes 418' shown in FIG. 21. The position of the notch 719 and the position of the through hole 418', i.e., the position of the disassembly positioning hole 21, are unlimited to be located at the center of the terminal end of the metal heat dissipating sheet 71. For example, they may be located at the terminal end of the metal heat dissipating sheet 71 and also located at the outer side of the metal heat dissipating sheet 71, or may be located at the terminal end of the metal heat dissipating sheet 71 and also located at the inner side of the metal heat dissipating sheet 71. Alternatively, the notch 719 and the through hole 418' may be not located at the terminal end of the metal heat dissipating sheet 71, but located at the inner side of the metal heat dissipating sheet 71, which means the notch 719 of the metal heat dissipating sheet 71 is opened toward another metal heat dissipating sheet 71 with the space 75 located therebetween.

Figure 22:
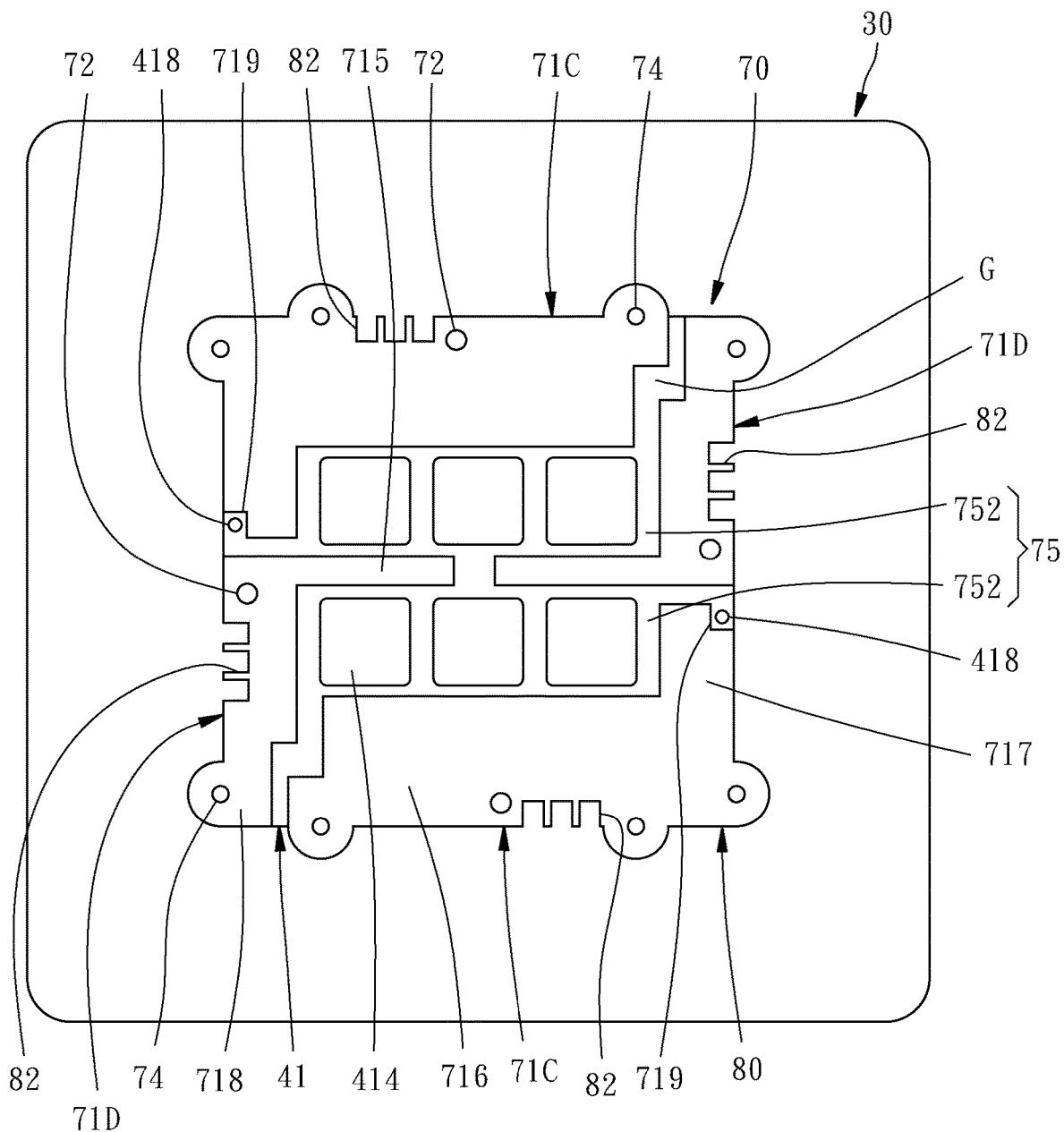

Taking the configuration similar to the metal heat dissipating layer shown in FIG. 16 as another example, as shown in FIG. 22, the metal heat dissipating sheets 71C may be each provided at the terminal end thereof with a notch 719 opened at the outer side of the metal heat dissipating layer 70. The disassembly positioning holes 21 may be located correspondingly to the notches 719, i.e., located at the positions of the two through holes 418 shown in FIG. 22.

Likewise, the monolithically made metal heat dissipating layers 70 as shown in FIG. 9 to FIG. 13 may be provided without such through hole 73 for pass of the positioning pin therethrough, and optionally provided with the notch opened toward the hollow portion 75 or toward the outside of the metal heat dissipating layer 70. The disassembly positioning hole 21 may be located correspondingly to the hollow portion 75 or the aforementioned notch.

As described above, the metal heat dissipating layers 70 in the present invention may be configured as being various types. The metal heat dissipating layers 70 provided with tearing lines 76 as shown in FIG. 9 to FIG. 13 enable the user to conveniently tear and remove the metal heat dissipating layer 70 without removing the fastening members 60. The configurations with the metal heat dissipating sheets directly separated from each other as shown in FIG. 6 to FIG. 8 and FIG. 14 to FIG. 23B enable the user to remove the metal heat dissipating layer 70 and then install different metal heat dissipating layers 70. The aforementioned metal heat dissipating sheets directly separated from each other may be configured abutted against each other without any gap therebetween (not shown), thereby convenient for assembly. Alternatively, the aforementioned metal heat dissipating sheets directly separated from each other may be configured as shown in FIG. 6 to FIG. 8 and FIG. 14 to FIG. 23B, wherein there are gaps G between the adjacent metal heat dissipating sheets, such that the gaps G can serve as heat dissipating passages for the heat inside the probe head to be discharged outwardly through the gaps G, thereby improving the heat dissipating effect.

The result of a simulation of the present invention is shown in FIG. 24. The simulation is performed in the situation that the metal heat dissipating layer 70 has gaps G, the situation without such gap and the situation without such metal heat dissipating layer. The simulation is set with a condition that the temperature in the central region for the installation of the probes is 125° C., so as to simulate the temperature distribution of the outer die 42, the metal heat dissipating layer 70 and the inner die 41 of the lower die unit 40B when the temperature of 125° C. is attained. The aforementioned three situations all have the result that the outer die 42 obviously has high temperature in the central region thereof, and the closer to the outer periphery, the lower the temperature is. The metal heat dissipating layer 70 and the inner die 41 also approximately have the distribution that the inside thereof is higher in temperature and the outer periphery is lower in temperature. The highest temperatures and lowest temperatures of the outer die 42, the metal heat dissipating layer 70 and the inner die 41 are as shown in FIG. 24. Although the aforementioned three situations are not quite different in the highest temperatures and lowest temperatures in the simulated results, they have obvious difference in distributive areas of high and low temperatures. Especially, the low temperature (about 114° C.) area of the inner die 41 in the situation that the metal heat dissipating layer 70 has the gaps G is obviously larger than that in the situation that the metal heat dissipating layer has no such gap. As shown in FIG. 24, the aforementioned three situations are obviously different in the percentage of the area with temperature higher than 116° C. of the inner die 41. The percentage of the area with temperature higher than 116° C. in the situation with the metal heat dissipating layer 70 is much lower than that in the situation without the metal heat dissipating layer. The percentage of the area with temperature higher than 116° C. in the situation that the metal heat dissipating layer 70 has the gaps G is also much lower than that in the situation that the metal heat dissipating layer 70 has no such gap. From this it is knowable that the gaps G of the metal heat dissipating layer 70 can improve the heat dissipating effect.

Figure 23A:
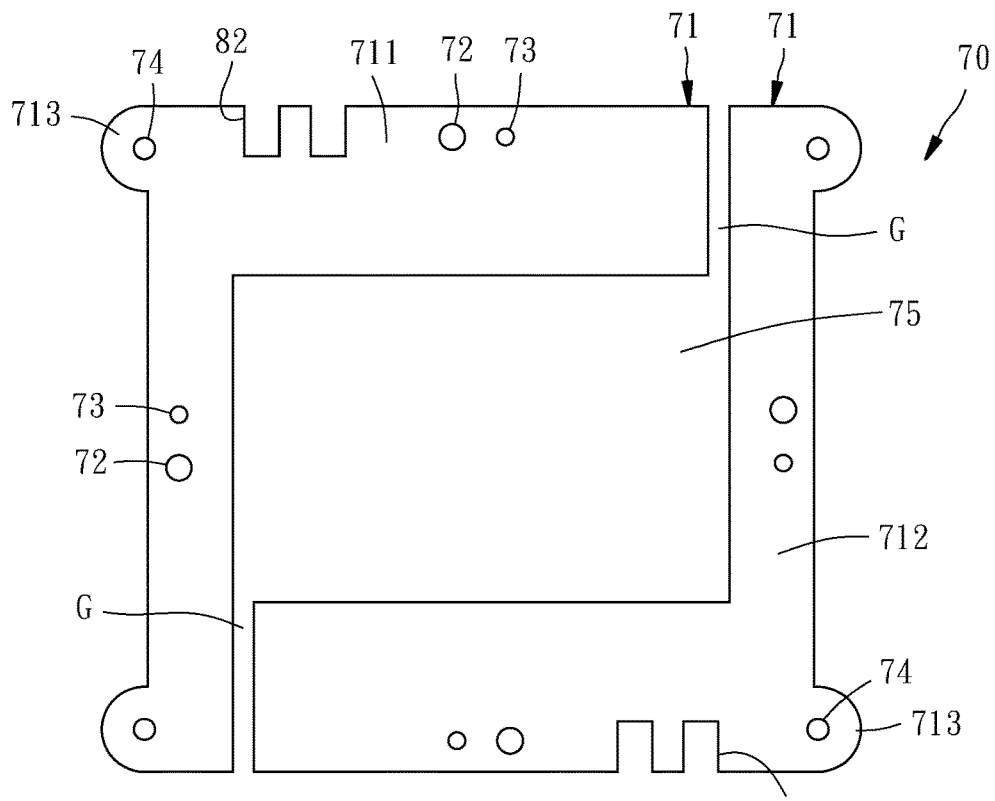
FIG. 23A and FIG. 23B are similar to FIG. 6, but showing different types of metal heat dissipating layers.
Figure 23B:
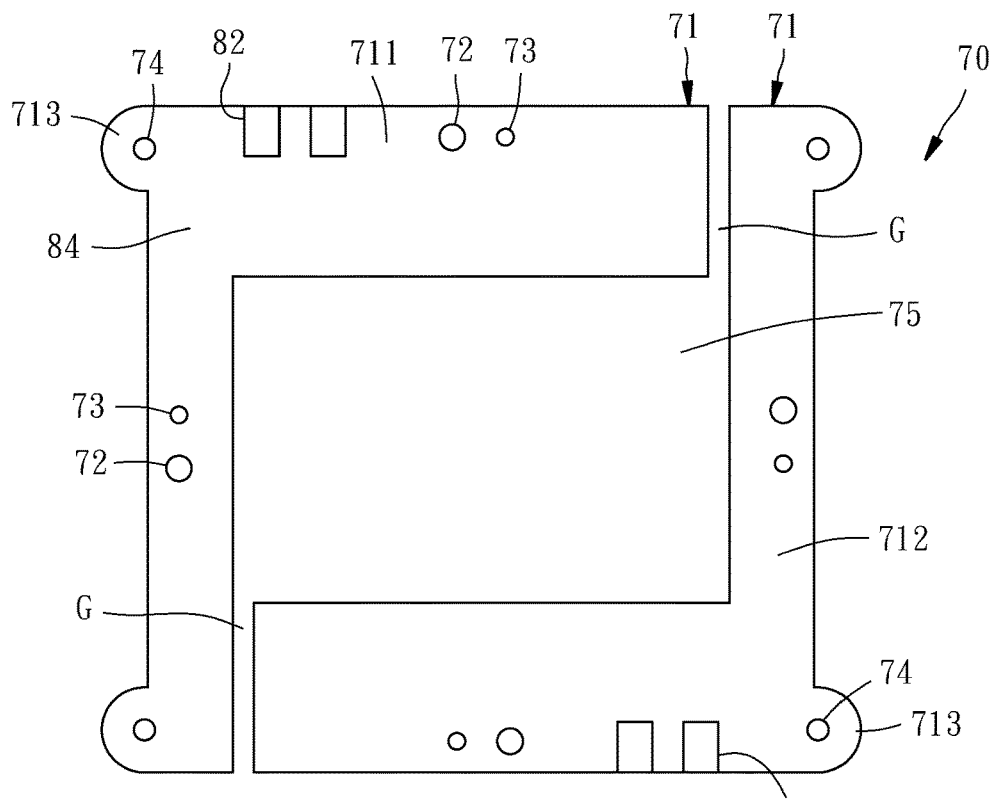

As shown in FIG. 23A and FIG. 23B, the metal heat dissipating layer 70 may be provided on the outer periphery thereof with one or a plurality of indentations 82 (unlimited in amount). The indentations 82 penetrate through the top surface 84 and bottom surface of the metal heat dissipating layer 70 for increasing the surface area of the outer periphery of the metal heat dissipating layer 70 to increase the heat dissipating area, so that the metal heat dissipating layer 70 has the structure similar to heat dissipating fins, thereby further improving the heat dissipating effect. The indentations 82 may penetrate through the metal heat dissipating layer 70 and thereby shaped as through grooves, as shown in FIG. 23A. Alternatively, the indentations 82 may not penetrate through the top and bottom surfaces of the metal heat dissipating layer 70 and thereby shaped as recessed grooves, as shown in FIG. 23B. The indentations 82 are recessed from a surface (e.g., top surface 84) of the metal heat dissipating layer 70 and not penetrate through the other surface (e.g., bottom surface).

Likewise, in the configuration shown in FIG. 22, there is a gap G between the adjacent metal heat dissipating sheets 71C and 71D, which can attain great heat dissipating effect. The metal heat dissipating layer 70 shown in FIG. 22 is also like those shown in FIG. 23A and FIG. 23B in that the metal heat dissipating layer 70 is provided on the outer periphery thereof with indentations 82. The indentations 82 penetrate through the top and bottom surfaces of the metal heat dissipating layer 70 and thereby shaped as through grooves for increasing the surface area of the outer periphery of the metal heat dissipating layer 70 to improve the heat dissipating effect. Specifically speaking, the indentations 82 penetrate through the top and bottom surfaces of the metal heat dissipating sheets 71C. In another embodiment of the present invention, the indentations are recessed from a surface of the metal heat dissipating layer 70. Specifically speaking, the indentations are recessed from a surface of the metal heat dissipating layer 70, thereby forming recesses on the surface of the metal heat dissipating layer 70. The aforementioned indentations shaped as through grooves may extend from the inner periphery to the outer periphery of the metal heat dissipating layer 70, thereby increasing the surface area of the metal heat dissipating layer 70 in contact with the ambient atmosphere and also communicating the space 75, in which the probe installation section 413 is located, with the external environment by the indentations shaped as through grooves, so that the heat in the probe installation section 413 can be discharged to the external environment through the indentations shaped as through grooves.

It is to be mentioned that the present invention takes only the configurations as shown in FIG. 23A, FIG. 23B and FIG. 22 as examples to illustrate that the metal heat dissipating layer 70 may be provided with the indentation 82 to improve the heat dissipating effect. In FIG. 23A and FIG. 23B, each metal heat dissipating sheet 71 of the metal heat dissipating layer 70 is provided on the outer periphery thereof with the indentation 82, but such structural feature is not to limit that every metal heat dissipating sheet must be provided with the indentation 82. The amount and position of the indentation 82 can be arranged according to requirements, and such structural feature is also applicable to other embodiments. The aforementioned indentation 82 not only has the heat dissipating effect, but also enables identification of the metal heat dissipating layer 70 or metal heat dissipating sheet. Specifically speaking, the metal heat dissipating layers 70 or metal heat dissipating sheets of different shapes or heat dissipating efficiency can be provided with the indentation 82 of different shape (through groove or recessed groove), width or amount. After the assembly of the probe head is accomplished, the user can still see the indentation 82 from the lateral sides of the probe head, and can identify the type of the metal heat dissipating layer 70 or metal heat dissipating sheet by the indentation 82. The above-described metal heat dissipating layer 70 provided with the gaps G between the metal heat dissipating sheets can also attain similar effect. From the lateral sides of the probe head, the user can see the indentations formed by the gaps G on the outer periphery of the metal heat dissipating layer 70, thereby identifying the type of the metal heat dissipating layer 70 or metal heat dissipating sheet.

At last, it should be mentioned again that the constituent elements disclosed in the above embodiments of the present invention are only taken as examples for illustration, not intended to limit the scope of the present invention. The substitution or variation of other equivalent elements should be included within the scope of the following claims of the present invention.

For example, in the embodiments, it takes one layer and two layers of metal heat dissipating layers for illustration. However, it is unlimited thereto, but may be a multi-layer configuration such as the configuration with three layers.

What is claimed is:

1. A heat dissipatable die unit, which is adapted to be disposed on a surface of a die, the die unit comprising:
an outer die, a metal heat dissipating layer and an inner die, the inner die, the metal heat dissipating layer and the outer die being piled in order from the surface of the die;
wherein the inner die comprises a probe installation section for a plurality of probes to be inserted therethrough, and a peripheral portion surrounding the probe installation section; the peripheral portion is provided on opposite sides thereof with an outer connecting surface, and an inner connecting surface for being connected to the die; the probe installation section has a recessed portion recessed from the inner connecting surface, and a protruding portion protruding from the outer connecting surface, so that the probe installation section is formed with a level difference portion bordering the peripheral portion;
wherein the outer die comprises an installation recess for the probes to be inserted therethrough, and a supporting portion surrounding the installation recess; the supporting portion has an inner surface; the installation recess is recessed from the inner surface; the installation recess is larger than the protruding portion of the inner die; the protruding portion is accommodated in the installation recess; and
wherein the metal heat dissipating layer is disposed between the peripheral portion of the inner die and the supporting portion of the outer die.

2. The heat dissipatable die unit as claimed in claim 1, wherein the metal heat dissipating layer comprises a metal heat dissipating sheet; the metal heat dissipating sheet is monolithically and annularly arranged surrounding the protruding portion; the protruding portion of the probe installation section of the inner die is located in a space surrounded by the metal heat dissipating sheet.

3. The heat dissipatable die unit as claimed in claim 1, wherein the metal heat dissipating layer comprises a plurality of metal heat dissipating sheets separatable from each other; the adjacent metal heat dissipating sheets are abutted against each other without any gap therebetween, or the adjacent metal heat dissipating sheets have a gap therebetween.

4. The heat dissipatable die unit as claimed in claim 1, wherein the inner die has a plurality of said protruding portions; the metal heat dissipating layer comprises a peripheral unit surrounding the protruding portions, and at least one strengthening rib extending from the peripheral unit to a space surrounded by the peripheral unit; the space surrounded by the peripheral unit is divided into a plurality of regions by the at least one strengthening rib; each of the regions is provided therein with at least one said protruding portion.

5. The heat dissipatable die unit as claimed in claim 1, wherein the metal heat dissipating layer has an outer periphery, and an indentation located on the outer periphery; the indentation penetrates through a top surface and a bottom surface of the metal heat dissipating layer, or the indentation is recessed from the top surface or the bottom surface of the metal heat dissipating layer.

6. The heat dissipatable die unit as claimed in claim 1, wherein the probe installation section of the inner die comprises an insertion portion for the probes to be inserted therethrough; the level difference portion is located between the insertion portion and the peripheral portion; a thickness of the insertion portion is smaller than a thickness of the peripheral portion.

7. The heat dissipatable die unit as claimed in claim 1, wherein a height of the level difference portion of the inner die is larger than a height of the protruding portion of the inner die.

8. The heat dissipatable die unit as claimed in claim 1, wherein a thickness of the peripheral portion of the inner die is smaller than a thickness of the supporting portion of the outer die.

9. The heat dissipatable die unit as claimed in claim 1, wherein a thickness of the metal heat dissipating layer is smaller than a height of the level difference portion.

10. The heat dissipatable die unit as claimed in claim 1, wherein a sum of a thickness of the metal heat dissipating layer and a thickness of the peripheral portion of the inner die is smaller than a height of the level difference portion or a height of the protruding portion.

11. The heat dissipatable die unit as claimed in claim 1, wherein the metal heat dissipating layer comprises two metal heat dissipating sheets; each of the metal heat dissipating sheets comprises two sections perpendicular to each other; the sections are located by four sides of the protruding portion of the inner die respectively.

12. The heat dissipatable die unit as claimed in claim 1, wherein the metal heat dissipating layer comprises four metal heat dissipating sheets; the metal heat dissipating sheets are located by four sides of the protruding portion of the inner die respectively.

13. The heat dissipatable die unit as claimed in claim 1, wherein at least a part of the metal heat dissipating layer is distanced from the protruding portion of the inner die by an interval.

14. The heat dissipatable die unit as claimed in claim 1, wherein the metal heat dissipating layer is made monolithically and shaped annularly to define a hollow portion; the protruding portion of the probe installation section of the inner die is located in the hollow portion of the metal heat dissipating layer; the metal heat dissipating layer has an inner periphery defining the hollow portion, an outer periphery, and a tearing line extending from the inner periphery to the outer periphery.

15. The heat dissipatable die unit as claimed in claim 1, wherein a gap is provided between the protruding portion of the inner die and the installation recess of the outer die; a height of the gap is larger than a thickness of the metal heat dissipating layer.

16. The heat dissipatable die unit as claimed in claim 1, wherein the surface of the die, on which the heat dissipatable die unit is disposed, faces toward a device under test.

17. The heat dissipatable die unit as claimed in claim 1, wherein the metal heat dissipating layer is monolithically and annularly made; the metal heat dissipating layer has a plurality of tearing lines; the tearing lines divide the metal heat dissipating layer into a plurality of metal heat dissipating sheets and make the metal heat dissipating sheets separatable from each other.

18. The heat dissipatable die unit as claimed in claim 17, wherein a plurality of said metal heat dissipating layers are disposed between the inner die and the outer die; each of the metal heat dissipating layers has an outer periphery, and an indentation located on the outer periphery and adjoining one of said tearing lines; the indentations of the adjacent metal heat dissipating layers are not aimed at each other.

19. A probe seat comprising:
a die having a top surface, a bottom surface opposite to the top surface, and an accommodating hole penetrating through the top surface and the bottom surface, the bottom surface facing toward a device under test; and
an upper die unit and a lower die unit, which are disposed on the top surface and the bottom surface of the die respectively;
wherein, at least one of the upper die unit and the lower die unit is a heat dissipatable die unit,
wherein a heat dissipatable die unit, comprising:
an outer die, a metal heat dissipating layer and an inner die, the inner die, the metal heat dissipating layer and the outer die being piled in order from the surface of the die;
wherein the inner die comprises a probe installation section for a plurality of probes to be inserted therethrough, and a peripheral portion surrounding the probe installation section; the peripheral portion is provided on opposite sides thereof with an outer connecting surface, and an inner connecting surface for being connected to the die; the probe installation section has a recessed portion recessed from the inner connecting surface, and a protruding portion protruding from the outer connecting surface, so that the probe installation section is formed with a level difference portion bordering the peripheral portion;
wherein the outer die comprises an installation recess for the probes to be inserted therethrough, and a supporting portion surrounding the installation recess; the supporting portion has an inner surface; the installation recess is recessed from the inner surface; the installation recess is larger than the protruding portion of the inner die; the protruding portion is accommodated in the installation recess; and wherein the metal heat dissipating layer is disposed between the peripheral portion of the inner die and the supporting portion of the outer die;
the recessed portion of the inner die the heat dissipatable die unit and the accommodating hole of the die collectively form a probe accommodating space.

20. The probe seat as claimed in claim 19, wherein the lower die unit is the heat dissipatable die unit.

* * * * *